(12) United States Patent
Ouellet et al.

(10) Patent No.: US 7,799,656 B2
(45) Date of Patent: *Sep. 21, 2010

(54) MICROCHANNELS FOR BIOMEMS DEVICES

(75) Inventors: Luc Ouellet, Granby (CA); Patrick Wright, Knowlton (CA)

(73) Assignee: DALSA Semiconductor Inc., Waterloo, Ontario (CA)

( * ) Notice: Subject to any disclaimer, the term of this patent is extended or adjusted under 35 U.S.C. 154(b) by 150 days.

This patent is subject to a terminal disclaimer.

(21) Appl. No.: 12/045,853

(22) Filed: Mar. 11, 2008

(65) Prior Publication Data

US 2008/0299695 A1  Dec. 4, 2008

Related U.S. Application Data

(60) Provisional application No. 60/894,930, filed on Mar. 15, 2007.

(51) Int. Cl.
*H01L 21/46* (2006.01)
*H01L 21/31* (2006.01)

(52) U.S. Cl. .................. 438/456; 438/458; 438/791; 257/E21.57

(58) Field of Classification Search .................. 438/50, 438/456, 458, 780, 781, 791–794; 257/E21.57
See application file for complete search history.

(56) References Cited

U.S. PATENT DOCUMENTS

| | | | |
|---|---|---|---|
| 4,882,245 A | 11/1989 | Gelorme et al. |
| 5,376,252 A | 12/1994 | Ekstrom et al. |
| 5,439,553 A | 8/1995 | Grant et al. |
| 5,591,139 A | 1/1997 | Lin et al. |
| 5,699,157 A | 12/1997 | Parce |
| 5,705,018 A | 1/1998 | Hartley |
| 5,716,852 A | 2/1998 | Yager et al. |
| 5,755,942 A | 5/1998 | Zanzucchi et al. |
| 5,779,868 A | 7/1998 | Parce et al. |
| 5,800,690 A | 9/1998 | Chow et al. |
| 5,842,787 A | 12/1998 | Kopf-Sill et al. |
| 5,849,208 A | 12/1998 | Hayes et al. |
| 5,852,495 A | 12/1998 | Parce |
| 5,855,801 A | 1/1999 | Lin et al. |
| 5,856,174 A | 1/1999 | Lipshutz et al. |
| 5,863,502 A | 1/1999 | Southgate et al. |
| 5,869,004 A | 2/1999 | Parce et al. |
| 5,876,675 A | 3/1999 | Kennedy |
| 5,880,071 A | 3/1999 | Parce et al. |
| 5,882,465 A | 3/1999 | McReynolds |
| 5,885,470 A | 3/1999 | Parce et al. |
| 5,922,210 A | 7/1999 | Brody et al. |
| 5,922,604 A | 7/1999 | Stapleton et al. |

(Continued)

OTHER PUBLICATIONS

"A comparison between wet HF etching and vapor HF etching for sacrificial oxide removal", A. Witvrouw et al.

(Continued)

*Primary Examiner*—Hsien-ming Lee
*Assistant Examiner*—Kevin Parendo
(74) *Attorney, Agent, or Firm*—Marks & Clerk; Richard J. Mitchell

(57) ABSTRACT

A method is disclosed for making a MEMS device wherein anhydrous HF exposed silicon nitride is used as a temporary adhesion layer allowing the transfer of a layer from a Carrier Wafer to a Device Wafer.

16 Claims, 13 Drawing Sheets

U.S. PATENT DOCUMENTS

| | | | |
|---|---|---|---|
| 5,932,100 A | 8/1999 | Yager et al. |
| 5,932,315 A | 8/1999 | Lum et al. |
| 5,942,443 A | 8/1999 | Parce et al. |
| 5,948,227 A | 9/1999 | Dubrow |
| 5,948,684 A | 9/1999 | Weigl et al. |
| 5,955,028 A | 9/1999 | Chow |
| 5,957,579 A | 9/1999 | Kopf-Sill et al. |
| 5,958,203 A | 9/1999 | Parce et al. |
| 5,958,694 A | 9/1999 | Nikiforov |
| 5,964,995 A | 10/1999 | Nikiforov et al. |
| 5,965,001 A | 10/1999 | Chow et al. |
| 5,965,410 A | 10/1999 | Chow et al. |
| 5,972,187 A | 10/1999 | Parce et al. |
| 5,972,710 A | 10/1999 | Weigl et al. |
| 5,980,719 A | 11/1999 | Cherukuri et al. |
| 5,989,402 A | 11/1999 | Chow et al. |
| 5,992,820 A | 11/1999 | Fare et al. |
| 6,001,231 A | 12/1999 | Kopf-Sill |
| 6,004,515 A | 12/1999 | Parce et al. |
| 6,007,775 A | 12/1999 | Yager |
| 6,011,252 A | 1/2000 | Jensen |
| 6,012,902 A | 1/2000 | Parce |
| 6,042,709 A | 3/2000 | Parce et al. |
| 6,042,710 A | 3/2000 | Dubrow |
| 6,043,080 A | 3/2000 | Lipshutz et al. |
| 6,046,056 A | 4/2000 | Parce et al. |
| 6,048,498 A | 4/2000 | Kennedy |
| 6,048,734 A | 4/2000 | Burns et al. |
| 6,054,277 A | 4/2000 | Furcht et al. |
| 6,056,269 A | 5/2000 | Johnson et al. |
| 6,057,149 A | 5/2000 | Burns et al. |
| 6,062,261 A | 5/2000 | Jacobson et al. |
| 6,063,589 A | 5/2000 | Kellogg et al. |
| 6,068,752 A | 5/2000 | Dubrow et al. |
| 6,071,478 A | 6/2000 | Chow |
| 6,073,482 A | 6/2000 | Moles |
| 6,074,725 A | 6/2000 | Kennedy |
| 6,074,827 A | 6/2000 | Nelson et al. |
| 6,078,340 A | 6/2000 | Jeanmaire et al. |
| 6,080,295 A | 6/2000 | Parce et al. |
| 6,082,140 A | 7/2000 | Ackler et al. |
| 6,086,740 A | 7/2000 | Kennedy |
| 6,086,825 A | 7/2000 | Sundberg et al. |
| 6,090,251 A | 7/2000 | Sundberg et al. |
| 6,091,502 A | 7/2000 | Weigl et al. |
| 6,096,656 A | 8/2000 | Matzke et al. |
| 6,100,541 A | 8/2000 | Nagle et al. |
| 6,103,199 A | 8/2000 | Bjornson et al. |
| 6,106,685 A | 8/2000 | McBride et al. |
| 6,107,044 A | 8/2000 | Nikiforov |
| 6,118,126 A | 9/2000 | Zanzucchi |
| 6,120,666 A | 9/2000 | Jacobson et al. |
| 6,123,798 A | 9/2000 | Gandhi et al. |
| 6,126,140 A | 10/2000 | Johnson et al. |
| 6,126,765 A | 10/2000 | Ohman |
| 6,129,826 A | 10/2000 | Nikiforov et al. |
| 6,129,854 A | 10/2000 | Ramsey et al. |
| 6,130,098 A | 10/2000 | Handique et al. |
| 6,131,410 A | 10/2000 | Swierkowski et al. |
| 6,132,685 A | 10/2000 | Kercso et al. |
| 6,136,212 A | 10/2000 | Mastrangelo et al. |
| 6,136,272 A | 10/2000 | Weigl et al. |
| 6,137,501 A | 10/2000 | Wen et al. |
| 6,143,152 A | 11/2000 | Simpson et al. |
| 6,143,248 A | 11/2000 | Kellogg et al. |
| 6,146,103 A | 11/2000 | Lee et al. |
| 6,148,508 A | 11/2000 | Wolk |
| 6,149,787 A | 11/2000 | Chow et al. |
| 6,149,870 A | 11/2000 | Parce et al. |
| 6,150,119 A | 11/2000 | Kopf-Sill et al. |
| 6,150,180 A | 11/2000 | Parce et al. |
| 6,153,073 A | 11/2000 | Dubrow et al. |
| 6,154,226 A | 11/2000 | York et al. |
| 6,156,181 A | 12/2000 | Parce et al. |
| 6,159,739 A | 12/2000 | Weigl et al. |
| 6,167,910 B1 | 1/2001 | Chow |
| 6,170,981 B1 | 1/2001 | Regnier et al. |
| 6,171,067 B1 | 1/2001 | Parce |
| 6,171,850 B1 | 1/2001 | Nagle et al. |
| 6,171,865 B1 | 1/2001 | Weigl et al. |
| 6,172,353 B1 | 1/2001 | Jensen |
| 6,174,675 B1 | 1/2001 | Chow et al. |
| 6,180,536 B1 | 1/2001 | Chong et al. |
| 6,186,660 B1 | 2/2001 | Kopf-Sill et al. |
| 6,887,770 B2 * | 5/2005 | Ueda et al. | 438/455 |
| 2006/0079071 A1 * | 4/2006 | Moriceau et al. | 438/459 |
| 2007/0059903 A1 * | 3/2007 | Yano et al. | 438/459 |
| 2007/0099289 A1 * | 5/2007 | Irimia et al. | 435/287.2 |
| 2007/0134927 A1 * | 6/2007 | Fortin et al. | 438/725 |

OTHER PUBLICATIONS

"A New Full-Dry Processing Method for MEMS", Keiichi Shimaoka et al., R&D Review of Toyota CRDL, vol. 37, No. 3, p. 59-66.

"Ammonium Bifluoride", Ammonium Hydrogen Fluoride; Ammonium Difluoride; Acid Ammonium Fluoride; Quantyka Fine Chemicals.

"Ammonium Fluorosilicate", Material Safety Data Sheet, LCI Ltd., The Fluoride Specialists, Jacksonville Beach, FL 32240-9000.

"Characterization of anhydrous HF gas-phase etching with CH3OH for sacrificial oxide removal", Jong Hyun Lee et al., Elsevier, Sensors and Actuators (1998) pp. 27-32.

"Characterization of residues formed by anhydrous hydrogen fluoride etching of doped oxides", Anthony J. Muscat et al., 2001 American Vacuum Society, Jul./Aug. 2001, pp. 1854-1861.

"Etching of Thermal Oxides in Low Pressure Anhydrous HF/CH3OH Gas Mixture at Elevated Temperature", J. Electrochem Soc., vol. 140, No. 4, Apr. 1993, J. Ruzyllo et al., pp. L64-L66.

"Fabrication of MEMS devices by using anhydrous HF gas-phase etching with alcoholic vapor", Won Ick Jang et al., Institute of Physics Publishing, Journal of Micromechanics and Microengineering, pp. 297-306.

"Gas-phase Etching of TEOS and PSG Sacrificial Layers Using Anhydrous HF and CH3OH", Hoi Hwan Chung et al., Journal of the Korean Physical Society, vol. 30, No. 3, Jun. 1997, p. 628-631.

"HF Etching of SI-Oxides and SI-Nitrides For Surface Micromachining", B. Du Bois et al., Leuven, Belgium.

"Modeling and Characterization of Gas-Phase Etching of Thermal Oxide and TEOS Oxide Using Anhydrous HF and CH3OH", Chun Su Lee et al., The Electrochemical Society, Inc., vol. 143, No. 3, Mar. 1996, p. 1099-1103.

"Optimization of 0-Level Packaging for RF-MEMS Devices", Anne Jourdain et al., IEEE, Transducers '03, The 12th International Conference on Solid State Sensors, Actuators and Microsystems, Boston, Jun. 8-12, 2003, p. 1915-1918.

"Reduced Pressure Etching of Thermal Oxides in Anhydrous HF/Alcoholic Gas Mixtures", Kevin Torek et ak., Journal of the Electrochemical Society, vol. 142, No. 4, Apr. 1995, p. 1322-1326.

"Selective Material Removal for Nanostructure Formation", Maria A. Lester et al., Semiconductor International, Jun. 1, 2003.

"Wafer Bonding Using Parylene and Wafer-Level Transfer of Free-Standing Parylene Membranes", Hanseup S. Kim et al., IEEE, Transducers '03, The 12th International Conference on Solid State Sensors, Actuators and Microsystems, Boston, Jun. 8-12, 2003, p. 790-793.

* cited by examiner

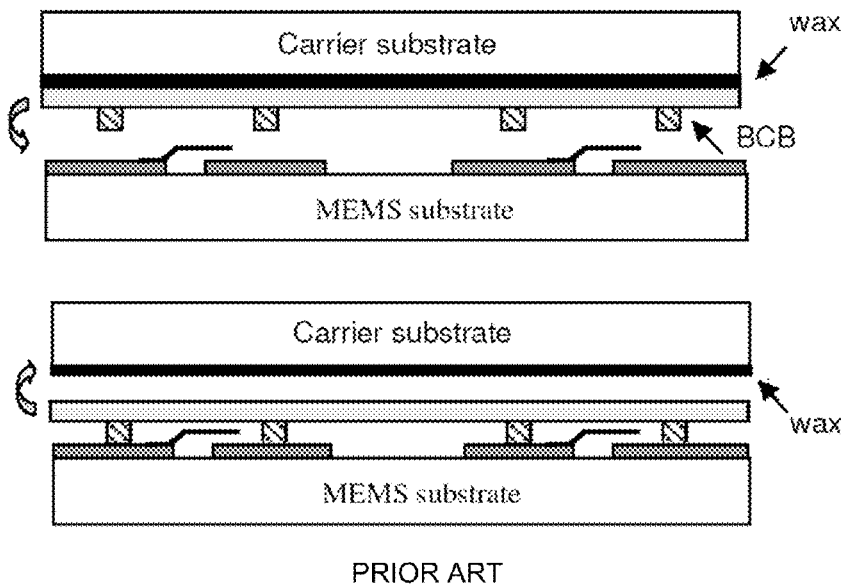

PRIOR ART

Fig. 2

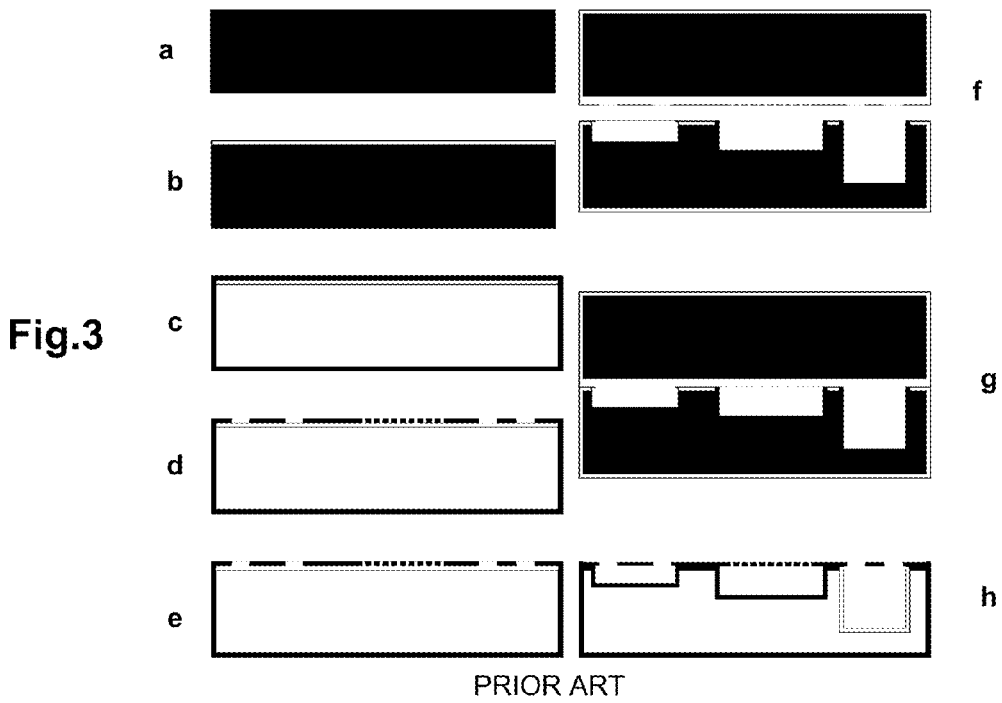

PRIOR ART a: Carrier wafer
b: Deposit a sacrificial layer
c: Deposit parylene on sacrificial layer
d: Pattern parylene as to expose sacrificial layer
e: Remove sacrificial layer as to suspend parylene
f: Deposit parylene on Device Wafer
g: Align and bond suspended parylene layer to Device Wafer's parylene layer
h: Detach Device Wafer from carrier. Parylene layer is transferred to Device Wafer

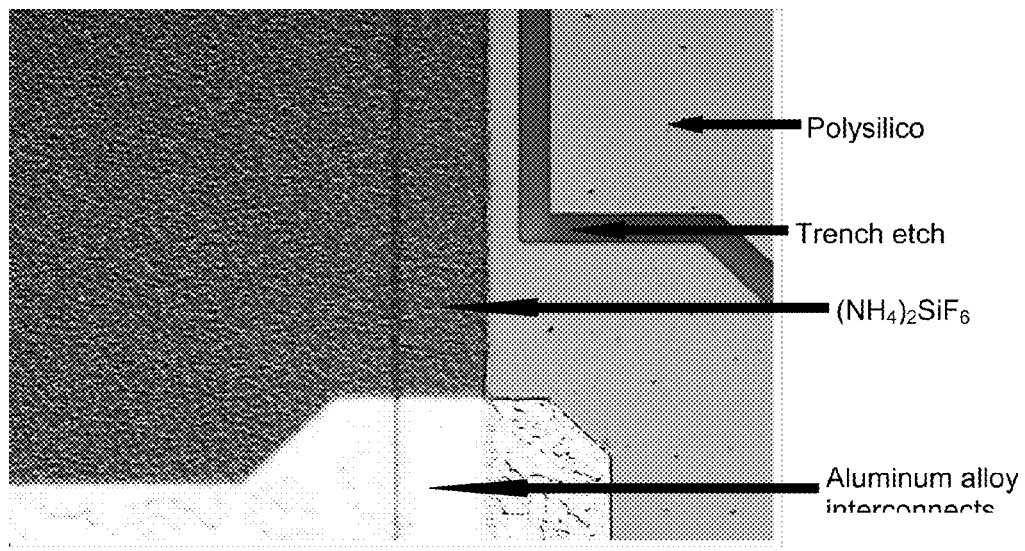
After anhydrous HF release and before evaporation in an oven
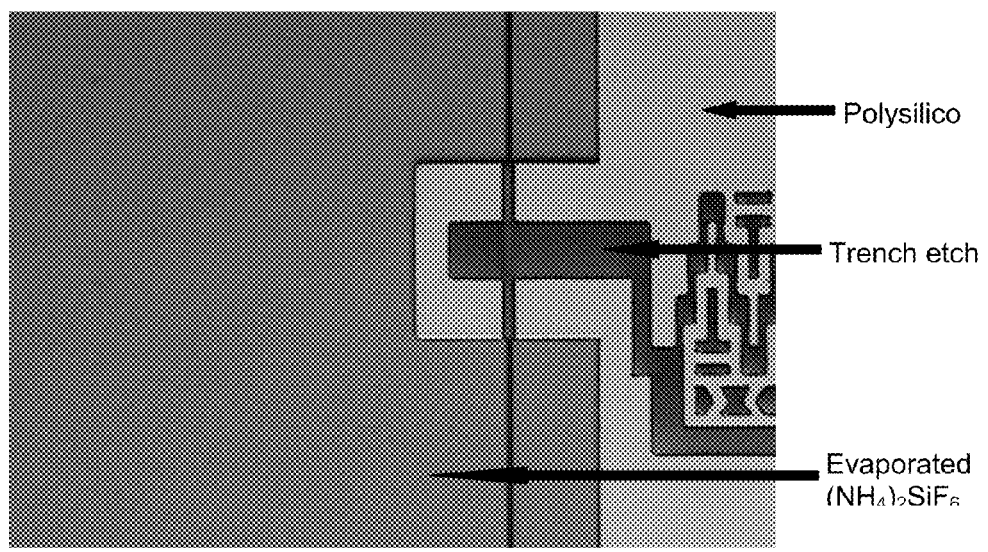
After anhydrous HF release and after evaporation in an oven
Fig. 7

Figure 10
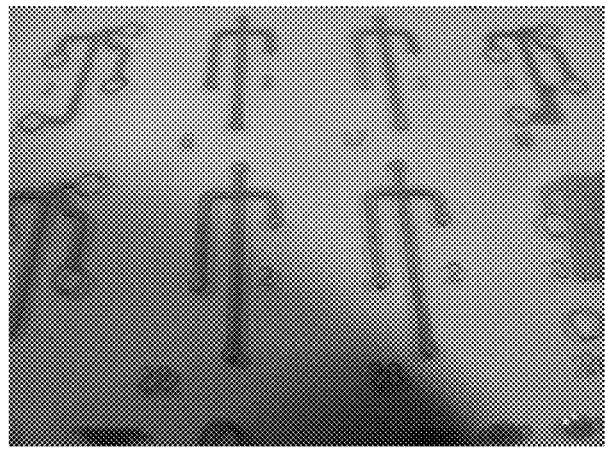
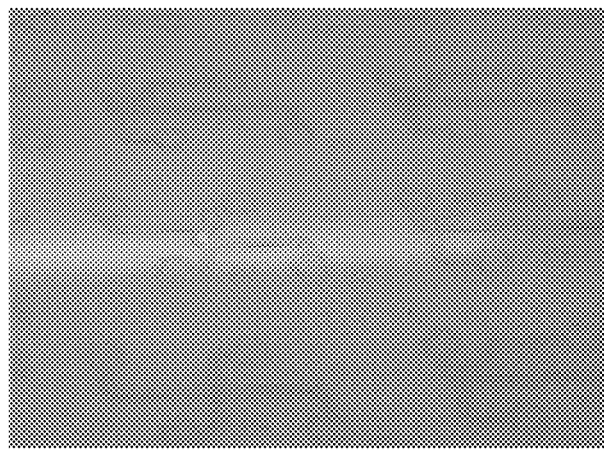
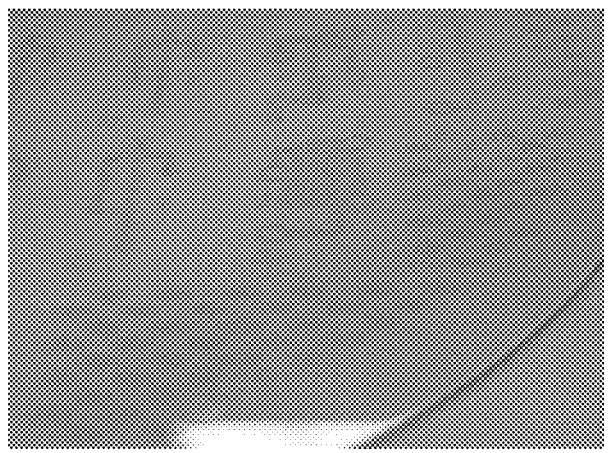

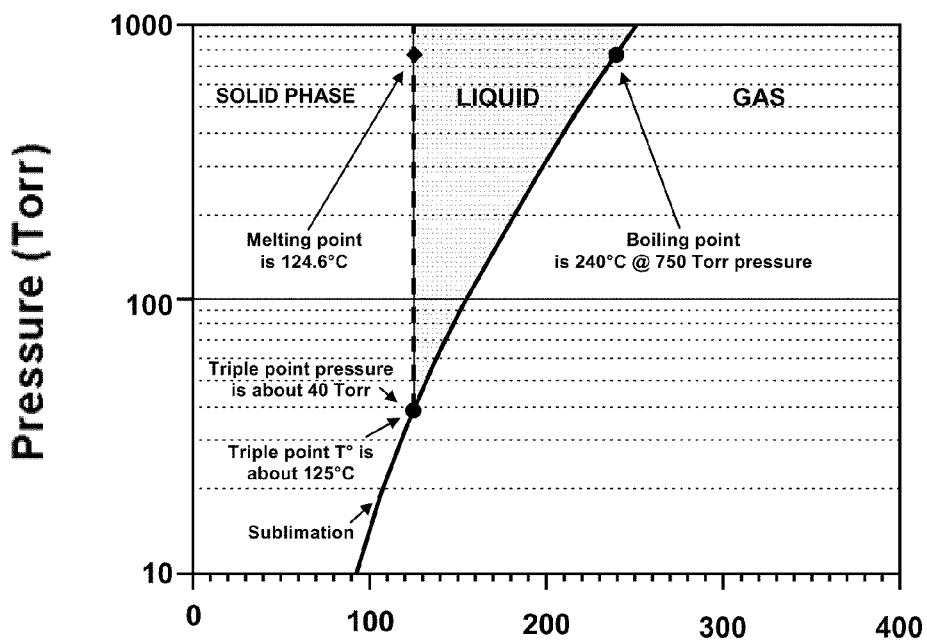
Fig. 9
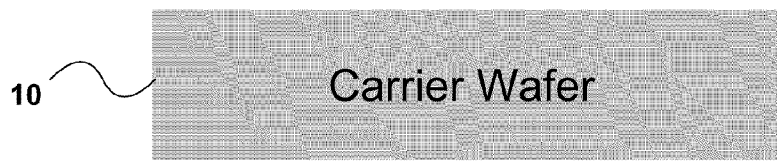
Fig. 11
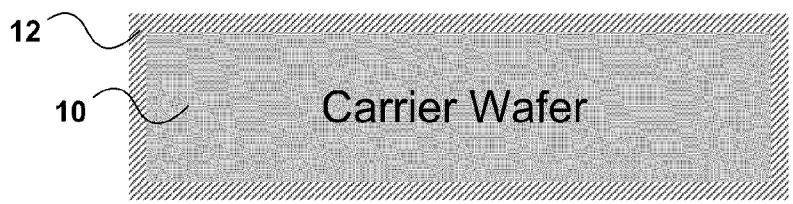
Fig. 12
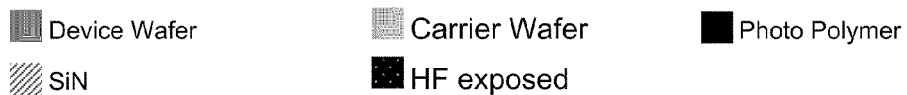

| Device Wafer | Carrier Wafer | Photo Polymer |
| SiN | HF exposed | |

| Device Wafer | Carrier Wafer | Photo Polymer |
| SiN | HF exposed | |

| | | |
|---|---|---|
| ▦ Device Wafer | ▦ Carrier Wafer | ■ Photo Polymer |
| ▨ SiN | ▨ HF exposed | |

MICROCHANNELS FOR BIOMEMS DEVICES

CROSS REFERENCE TO RELATED APPLICATION

This application claims the benefit under 35 USC 119(e) of prior U.S. application No. 60/894,930, the contents of which are herein incorporated by reference.

FIELD OF THE INVENTION

This invention relates to micro-electromechanical systems (MEMS) devices, and in particular, but not exclusively, to a method of fabricating microchannels in such devices for use in biological applications.

BACKGROUND OF THE INVENTION

Various techniques for fabricating microchannels in BIOMEMS devices are known in the prior art. Such techniques are described in the following patent applications: U.S. Pat. No. 6,186,660 <<Microfluidic systems incorporating varied channel dimensions>>; U.S. Pat. No. 6,180,536 <<Suspended moving channels and channel actuators for . . . >>; U.S. Pat. No. 6,174,675 <<Electrical current for controlling fluid parameters in . . . >>; U.S. Pat. No. 6,172,353 <<System and method for measuring low power signals>>; U.S. Pat. No. 6,171,865 <<Simultaneous analyte determination and reference . . . >>; U.S. Pat. No. 6,171,850 <<Integrated devices and systems for performing . . . >>; U.S. Pat. No. 6,171,067 <<Micropump>>; U.S. Pat. No. 6,170,981 <<In situ micromachined mixer for microfluidic analytical . . . >>; U.S. Pat. No. 6,167,910 <<Multi-layer microfluidic devices>>; U.S. Pat. No. 6,159,739 <<Device and method for 3-dimensional alignment of . . . >>; U.S. Pat. No. 6,156,181 <<Controlled fluid transport microfabricated polymeric . . . >>; U.S. Pat. No. 6,154,226 <<Parallel print array>>; U.S. Pat. No. 6,153,073 <<Microfluidic devices incorporating improved channel . . . >>; U.S. Pat. No. 6,150,180 <<High throughput screening assay systems in . . . >>; U.S. Pat. No. 6,150,119 <<Optimized high-throughput analytical system>>; U.S. Pat. No. 6,149,870 <<Apparatus for in situ concentration and/or dilution of . . . >>; U.S. Pat. No. 6,149,787 <<External material accession systems and methods>>; U.S. Pat. No. 6,148,508 <<Method of making a capillary for electrokinetic . . . >>; U.S. Pat. No. 6,146,103 <<Micromachined magnetohydrodynamic actuators . . . >>; U.S. Pat. No. 6,143,248 <<Capillary microvalve>>; U.S. Pat. No. 6,143,152 <<Microfabricated capillary array electrophoresis device . . . >>; U.S. Pat. No. 6,137,501 <<Addressing circuitry for microfluidic printing apparatus>>; U.S. Pat. No. 6,136,272 <<Device for rapidly joining and splitting fluid layers>>; U.S. Pat. No. 6,136,212 <<Polymer-based micromachining for microfluidic devices>>; U.S. Pat. No. 6,132,685 <<High throughput microfluidic systems and methods>>; U.S. Pat. No. 6,131,410 <<Vacuum fusion bonding of glass plates>>; U.S. Pat. No. 6,130,098 <<Moving microdroplets>>; U.S. Pat. No. 6,129,854 <<Low temperature material bonding technique>>; U.S. Pat. No. 6,129,826 <<Methods and systems for enhanced fluid transport>>; U.S. Pat. No. 6,126,765 <<Method of producing microchannel/microcavity . . . >>; U.S. Pat. No. 6,126,140 <<Monolithic bi-directional microvalve with enclosed . . . >>; U.S. Pat. No. 6,123,798 <<Methods of fabricating polymeric structures . . . >>; U.S. Pat. No. 6,120,666 <<Microfabricated device and method for multiplexed . . . >>; U.S. Pat. No. 6,118,126 <<Method for enhancing fluorescence>>; U.S. Pat. No. 6,107,044 <<Apparatus and methods for sequencing nucleic . . . >>; U.S. Pat. No. 6,106,685 <<Electrode combinations for pumping fluids>>; U.S. Pat. No. 6,103,199 <<Capillary electroflow apparatus and method>>; U.S. Pat. No. 6,100,541 <<Microfluidic devices and systems incorporating . . . >>; U.S. Pat. No. 6,096,656 <<Formation of microchannels from low-temperature . . . >>; U.S. Pat. No. 6,091,502 <<Device and method for performing spectral . . . >>; U.S. Pat. No. 6,090,251 <<Microfabricated structures for facilitating fluid . . . >>; U.S. Pat. No. 6,086,825 <<Microfabricated structures for facilitating fluid . . . >>; U.S. Pat. No. 6,086,740 <<Multiplexed microfluidic devices and systems>>; U.S. Pat. No. 6,082,140 <<Fusion bonding and alignment fixture>>; U.S. Pat. No. 6,080,295 <<Electropipettor and compensation means for . . . >>; U.S. Pat. No. 6,078,340 <<Using silver salts and reducing reagents in . . . >>; U.S. Pat. No. 6,074,827 <<Microfluidic method for nucleic acid purification and . . . >>; U.S. Pat. No. 6,074,725 <<Fabrication of microfluidic circuits by printing techniques>>; U.S. Pat. No. 6,073,482 <<Fluid flow module>>; U.S. Pat. No. 6,071,478 <<Analytical system and method>>; U.S. Pat. No. 6,068,752 <<Microfluidic devices incorporating improved channel . . . >>; U.S. Pat. No. 6,063,589 <<Devices and methods for using centripetal . . . >>; U.S. Pat. No. 6,062,261 <<Microfluldic circuit designs for performing . . . >>; U.S. Pat. No. 6,057,149 <<Microscale devices and reactions in microscale devices>>; U.S. Pat. No. 6,056,269 <<Microminiature valve having silicon diaphragm>>; U.S. Pat. No. 6,054,277 <<Integrated microchip genetic testing system>>; U.S. Pat. No. 6,048,734 <<Thermal microvalves in a fluid flow method>>; U.S. Pat. No. 6,048,498 <<Microfluidic devices and systems>>; U.S. Pat. No. 6,046,056 <<High throughput screening assay systems in . . . >>; U.S. Pat. No. 6,043,080 <<Integrated nucleic acid diagnostic device>>; U.S. Pat. No. 6,042,710 <<Methods and compositions for performing molecular>>; U.S. Pat. No. 6,042,709 <<Microfluidic sampling system and methods>>; U.S. Pat. No. 6,012,902 <<Micropump>>; U.S. Pat. No. 6,011,252 <<Method and apparatus for detecting low light levels>>; U.S. Pat. No. 6,007,775 <<Multiple analyte diffusion based chemical sensor>>; U.S. Pat. No. 6,004,515 <<Methods and apparatus for in situ concentration . . . >>; U.S. Pat. No. 6,001,231 <<Methods and systems for monitoring and controlling . . . >>; U.S. Pat. No. 5,992,820 <<Flow control in microfluidics devices by controlled . . . >>; U.S. Pat. No. 5,989,402 <<Controller/detector interfaces for microfluidic systems>>; U.S. Pat. No. 5,980,719 <<Electrohydrodynamic receptor>>; U.S. Pat. No. 5,972,710 <<Microfabricated diffusion-based chemical sensor>>; U.S. Pat. No. 5,972,187 <<Electropipettor and compensation means for . . . >>; U.S. Pat. No. 5,965,410 <<Electrical current for controlling fluid parameters in . . . >>; U.S. Pat. No. 5,965,001 <<Variable control of electroosmotic and/or . . . >>; U.S. Pat. No. 5,964,995 <<Methods and systems for enhanced fluid transport>>; U.S. Pat. No. 5,958,694 <<Apparatus and methods for sequencing nucleic acids . . . >>; U.S. Pat. No. 5,958,203 <<Electropipettor and compensation means for . . . >>; U.S. Pat. No. 5,957,579 <<Microfluidic systems incorporating varied channel . . . >>; U.S. Pat. No. 5,955,028 <<Analytical system and method>>; U.S. Pat. No. 5,948,684 <<Simultaneous analyte determination and reference . . . >>; U.S. Pat. No. 5,948,227 <<Methods and systems for performing electrophoretic . . . >>; U.S. Pat. No. 5,942,443 <<High throughput screening assay systems in . . . >>; U.S. Pat. No. 5,932,315 <<Microfluidic structure assembly with mating . . . >>; U.S. Pat. No. 5,932,100 <<Microfabricated differential extraction device and . . . >>;

U.S. Pat. No. 5,922,604 <<Thin reaction chambers for containing and handling . . . >>; U.S. Pat. No. 5,922,210 <<Tangential flow planar microfabricated fluid filter and . . . >>; U.S. Pat. No. 5,885,470 <<Controlled fluid transport in microfabricated polymeric . . . >>; U.S. Pat. No. 5,882,465 <<Method of manufacturing microfluidic devices>>; U.S. Pat. No. 5,880,071 <<Electropipettor and compensation means for . . . >>; U.S. Pat. No. 5,876,675 <<Microfluidic devices and systems>>; U.S. Pat. No. 5,869,004 <<Methods and apparatus for in situ concentration . . . >>; U.S. Pat. No. 5,863,502 <<Parallel reaction cassette and associated devices>>; U.S. Pat. No. 5,856,174 <<Integrated nucleic acid diagnostic device>>; U.S. Pat. No. 5,855,801 <<IC-processed microneedles>>; U.S. Pat. No. 5,852,495 <<Fourier detection of species migrating in a . . . >>; U.S. Pat. No. 5,849,208 <<Making apparatus for conducting biochemical analyses>>; U.S. Pat. No. 5,842,787 <<(Microfluidic systems incorporating varied channel . . . >>; U.S. Pat. No. 5,800,690 <<Variable control of electroosmotic and/or . . . >>; U.S. Pat. No. 5,779,868 <<Electropipettor and compensation means for . . . >>; U.S. Pat. No. 5,755,942 <<Partitioned microelectronic device array>>; U.S. Pat. No. 5,716,852 <<Microfabricated diffusion-based chemical sensor>>; U.S. Pat. No. 5,705,018 <<Micromachined peristaltic pump>>; U.S. Pat. No. 5,699,157 <<Fourier detection of species migrating in a . . . >>; U.S. Pat. No. 5,591,139 <<IC-processed microneedles>>; and U.S. Pat. No. 5,376,252 <<Microfluidic structure and process for its manufacture>>.

The paper by L. L. Sohn, O. A. Saleh, G. R. Facer, A. J. Beavis, R. S. Allan, and D. A. Notterman, 'Capacitance cytometry: Measuring biological cells one by one', Proceedings of the National Academy of Sciences (USA), Vol. 97, No. 20, Sep. 26, 2000, pp. 10687-10690 discloses a polydimethylsiloxane (PDMS) biochip capable of capacitance detection of biological entities (mouse cells).

This prior art shows that passive micro-channel biochip devices are fabricated using fusion bonding of a combination of various substrates, such as: acrylonitrile-butadiene-styrene copolymer, polycarbonate, polydimethylsiloxane (PDMS), polyethylene, polymethylmethacrylate (PMMA), polymethylpentene, polypropylene, polystyrene, polysulfone, polytetrafluoroethylene (PTFE), polyurethane, polyvinylchloride (PVC), polyvinylidine fluoride (PVF). These Prior Art USA patents show that mechanical stamping or thermal forming techniques are used to define a network of micro-channels in a first substrate prior its fusion bonding to another such substrate, as to form microchannels between the two bonded substrates. The result is a simple passive micro-channel biochip device which can be patterned with conductive layers as to connect an external processor used to provoke fluid movement by electrophoresis or electroosmosis, analysis and data generation. An example of such passive micro-channel biochip devices obtained from the fusion of such polymeric substrates is shown in U.S. Pat. No. 6,167,910 <<Multi-layer microfluidic devices>>.

The Prior Art also indicates that passive micro-channel biochip devices can be fabricated from the combination of various micro-machined silica or quartz substrates. Again, assembly and fusion bonding is required. The result is again a simple passive biochip device which can be patterned with conductive layers as to connect an external processor used to provoke fluid movement by electrophoresis or electroosmosis, analysis and data generation. An example of such passive micro-channel biochip devices obtained from the fusion of such silica substrates is shown in U.S. Pat. No. 6,131,410 <<Vacuum fusion bonding of glass plates>>.

The cited US patents also indicate that passive micro-channel biochip devices can be fabricated from a passive micro-machined silicon substrate. In that case, the silicon substrate is used as a passive structural material. Again, assembly and fusion bonding of at least two sub-assemblies is required. The result is again a simple passive biochip to connect to an external processor used to provoke fluid movement, analysis and data generation. An example of such passive micro-channel biochip devices obtained from a passive micro-machined silicon substrate is shown in U.S. Pat. No. 5,705,018 <<Micromachined peristaltic pump>>.

The cited US patents also indicate that active micro-reservoir biochip devices can be fabricated from machining directly into an active silicon substrate. In that case, the control electronics integrated in the silicon substrate is used as an active on-chip fluid processor and communication device. The result is a sophisticated biochip device which can perform, into pre-defined reservoirs, various fluidics, analysis and (remote) data communication functions without the need of an external fluid processor in charge of fluid movement, analysis and data generation. An example of such active micro-reservoir biochip devices obtained from an active micro-machined silicon substrate is shown in U.S. Pat. No. 6,117,643 <<(Bioluminescent bioreporter integrated circuit>>.

These Prior Art references also indicate that passive polydimethylsiloxane (PDMS) biochips have been developed for the detection of biological entities using gold coated capacitor electrodes. FIG. 1 shows an example of such passive polydimethylsiloxane (PDMS) biochips with gold electrodes (L. L. Sohn, O. A. Saleh, G. R. Facer, A. J. Beavis, R. S. Allan, and D. A. Notterman, 'Capacitance cytometry: Measuring biological cells one by one', Proceedings of the National Academy of Sciences (USA), Vol. 97, No. 20, Sep. 26, 2000, pp. 10687-10690).

These Prior Art references also indicate that wax has been used to fabricate such microchannels. FIG. 2 shows that this process requires the top covers of the microchannels to be first bonded to a carrier wafer using a low temperature wax. Then, a photosensitive benzocyclobutene, BCB, is spun-on, exposed and developed as to define the sidewalls of the microchannels. Then the photodefined BCB of the carrier wafer is properly aligned and bonded to a receiving wafer integrating the bottoms of the microchannels. Then the wax of the carrier wafer is heated above its melting point as to detach the BCB bonded sidewalls and covers of the carrier wafer onto the bottoms of the receiving wafer, thus creating microchannels. An example of such an approach in shown in the paper by A. Jourdain, X. Rottenberg, G. Carchon and H. A. C. Tilmanstitled, 'Optimization of 0-Level Packaging for RF-MEMS Devices', Transducers 2003, The 12th International Conference on Solid State Sensors, Actuators and Microsystems, Boston, Jun. 8-12, 2003, pp. 1915-1918 <<

These Prior Art references also indicate that parylene could be used to fabricate such microchannels. FIG. 3 shows that a carrier wafer could be first coated with 1.3 um of AZ1813 sacrificial photoresist over which a 0.38 um thick layer of parylene could be deposited and patterned as to expose the underlying layer of parylene. Following local etch of the exposed parylene the underlying sacrificial photoresist could be dissolved in acetone as to leave an array of free-standing parylene covers on the carrier wafer. The patterned receiving wafer integrating the sidewalls and bottoms of the microchannels could be coated with another layer of 0.38 um thick layer of parylene, could be aligned and could be pressed against the free standing pattern of parylene on the carrier wafer while heating at 230° C. under a vacuum of $1.5*10^{-4}$ Torr. The two parylene layers could polymerize together and will result in bond strength of 3.6 MPa. An example of such an approach in shown in the paper by H. S. Kim and K. Najafi, 'Wafer Bonding Using Parylene and Wafer-Level Transfer of Free-Standing Parylene Membranes', Transducers 2003, The 12th International Conference on Solid State Sensors, Actuators and Microsystems, Boston, June 8-12, 2003, pp. 790-793.

SUMMARY OF THE INVENTION

Embodiments of the present invention provide a new, simple, inexpensive, high precision, gold-free, sodium-free and potassium-free process allowing the formation, at a temperature of less than 250° C., of hundreds if not thousands of microfluidics microchannels on a CMOS wafer integrating hundreds if not thousands of digital and/or analog CMOS control logic and/or high voltage CMOS drivers capable of performing sensing and/or microfluidics actuation functions. The novel BioMEMS fabrication process uses a layer of silicon nitride exposed to anhydrous hydrofluoric acid as a temporary adhesion layer between a carrier wafer and a multitude of photolithographically defined microfluidics microchannels to be transferred onto the Device Wafer integrating a large number (potentially hundreds or thousands) of digital and/or analog CMOS control logic and/or high voltage CMOS drivers capable of performing sensing and/or microfluidics actuation functions.

Thus in accordance with a first aspect of the invention there is provided a method of making a MEMS device, comprising depositing a silicon nitride layer on a first part; chemically modifying said silicon nitride layer to form a modified surface layer subject to thermal decomposition into gaseous by-products; forming a first structure on said modified surface layer; forming a second structure on a second part; bonding said first and second structures together to form a integrated device; and applying heat to decompose said modified surface layer and thereby separate one of said parts from said bonded structures.

According to a second aspect of the invention there is provided a method of forming a MEMS device containing microchannels, comprising depositing a silicon nitride layer on a carrier wafer; modifying a surface portion of said silicon nitride layer by exposure to anhydrous HF to form a modified surface layer; forming a patterned first structure on said modified surface layer; forming a patterned second structure on a device wafer; bonding said first and second structure together to form microchannels; and releasing said carrier wafer by heating said structures to decompose said modified surface layer.

Embodiments of the present invention thus provide new, simple, inexpensive, high logic and/or high voltage CMOS drivers capable of performing sensing and/or microfluidics actuation functions in MEMS devices.

BRIEF DESCRIPTION OF THE DRAWINGS

The present invention will be described in more detail, by way of example only, with reference to the accompanying drawings, in which:—

FIG. 2 shows a form of O-level packaging for RF MEMS devices;

FIG. 3 shows the transfer of free-standing parylene membranes;

FIG. 7 shows the top view optical pictures of a MEMS device released by removing the sacrificial oxide using the anhydrous HF release process;

FIG. 9 is a sketch of the ammonium bifluoride phase diagram proposed by B. Du Bois (IMEC, 1999);

FIG. 10 shows arrays of microchannels produced by the present invention;

FIG. 11 shows the silicon wafer used as Carrier Wafer substrate;

FIG. 12 shows the silicon nitride deposited onto the Carrier Wafer prior to exposure to anhydrous HF;

DETAILED DESCRIPTION OF THE PREFERRED EMBODIMENTS

Figure 1:
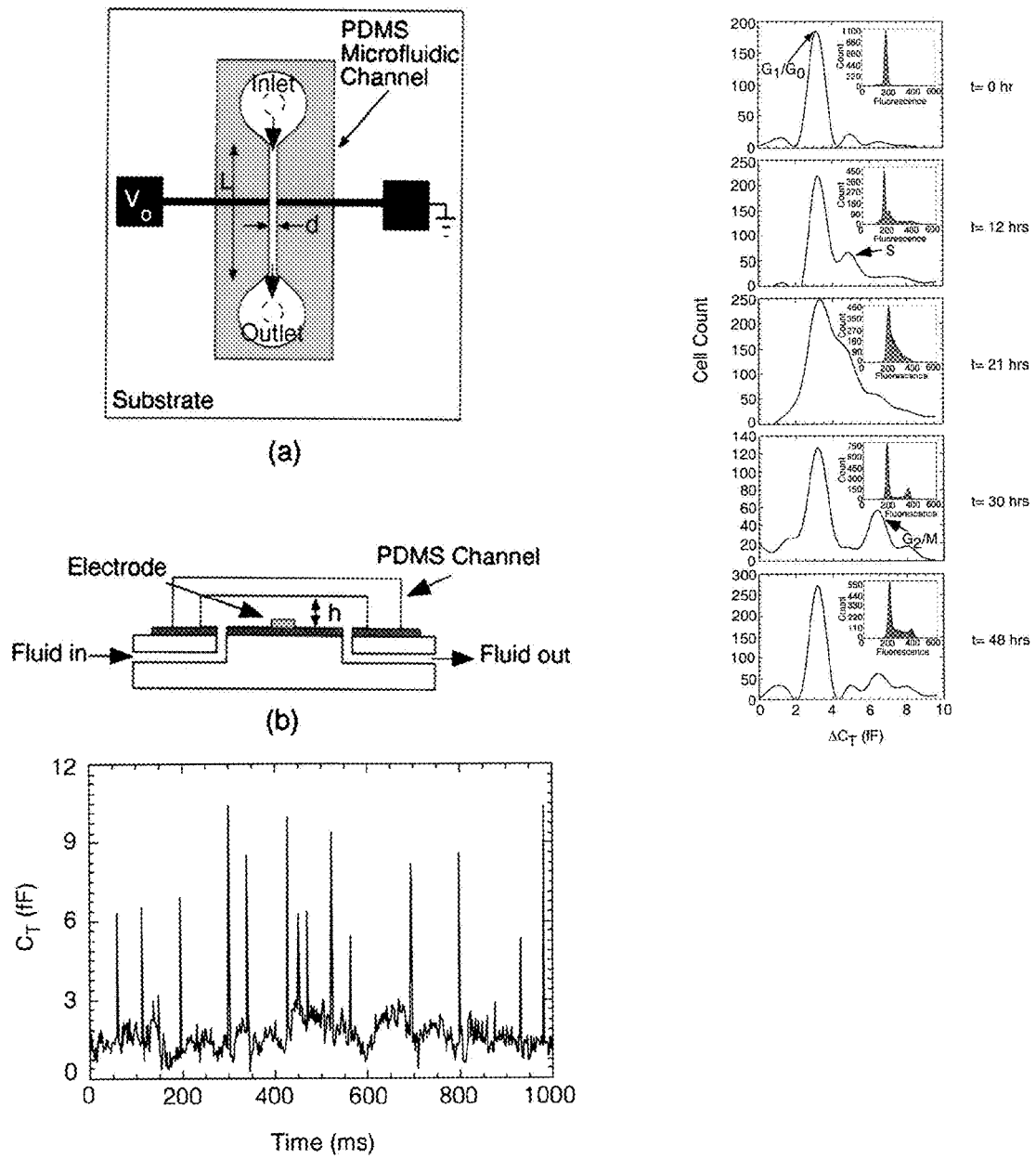
FIG. 1 shows an example of passive polydmethylsiloxane biochips with gold electrodes.

In accordance with embodiments of the invention a layer of silicon nitride, $Si_3N_4$, to is exposed to an anhydrous hydrofluoric acid, HF. This exposure results in the transformation of the silicon nitride layer into a layer of ammonium fluorosilicate, $(NH_4)_2SiF_6$, and in the evaporation of silicon tetrafluoride, $SiF_4(g)$:

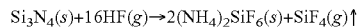

$$Si_3N_4(s)+16HF(g)\rightarrow 2(NH_4)_2SiF_6(s)+SiF_4(g)\uparrow$$

The following documents are cited as references to this anhydrous HF process typically used for the stiction-free release of advanced MEMS devices integrating sensitive mechanical parts prone to stiction: R. S. Blackwood, R. L. Biggerstaff, L. D. Clements, R. Cleavelin, "Gaseous Process and Apparatus for Removing Films from Substrates", U.S. Pat. No. 4,749,440, Jun. 7, 1988; J. Ruzyllo, K. Torek, C. Draffon, R. Grant, R. Novak, "Etching of Thermal Oxides in Low Pressure Anhydrous HF/CH₃OH Gas Mixtures at Elevated Temperatures", J. Electrochem Soc., Vol. 140, No. 4, April 1993, pp. L64-L66; U.S. Pat. No. 5,439,553, "Controlled Etching of Oxides via Gas Phase reactions", Aug. 8, 1995; K. Torek, J. Ruzyllo, R. Grant, R. Novak, "Reduced Pressure Etching of Thermal Oxides in Anhydrous HF/Alcoholic Gas Mixtures", J. Electrochem Soc., Vol. 142, No. 4, April 1995, pp. 1322-1326; C. S. Lee, J. T. Baek, H. J. Yoo, S. E. Woo, "Modeling and Characterization of Gas-Phase Etching of Thermal Oxide and TEOS Oxide Using Anhydrous HF and CH₃OH", J. Electrochem Soc., Vol. 143, No. 3, March 1996. pp. 1099-1103; H. H. Chung, W. I. Jang, C. S. Lee, J. H. Lee, H. J. Yoo, "Gas-phase Etching of TEOS and PSG Sacricial Layers using Anhydrous HF and CH₃OH", Journal of the Korean Physical Society, Vol. 30, No. 3, June 1997, pp. 628-631; J. H. Lee, W. I. Jang, C. S. Lee, Y. I. Lee, C. A. Choi, J. T. Baek, H. J. Yoo, "Characterization of Anhydrous HF Gas-Phase Etching with CH₃OH for Sacrificial Oxide Removal", Sensors and Actuators, A64, 1998, pp. 27-32; B. Du Bois, G. Vereecke, A. Witvrouw, P. De Moor, C. Van Hoof, A. De Caussemaeker, A. Verbist, "HF Etching of Si-oxides and Si-nitrides for Surface Micromachining", IMEC, Kapeldreef 75, B-3001 Leuven, Belgium, IST Project SUMICAP (IST-1999-10620); A. Witvrouw, B. Du Bois, P. De Moor, A. Verbist, C. Van Hoof, H. Bender, K. Baert, "A comparison between wet HF etching and vapor HF etching for sacrificial oxide removal", Proc. SPIE Micromachining and Microfabrication Process Technology VI; September 2000, Vol. 4174, 2000, pp. 130-141; A. J. Muscat, A. G. Thorsness, G. Montano-Miranda, "Characterization of Residues Formed by Anhydrous Hydrogen Fluoride Etching of Doped Oxides", J. Vac. Sci. Technol. A19(4), July-August 2001, pp. 1854-1861; W. I. Jang, C. A. Choi, M. L. Lee, C. H. Jun, Y. T. Kim, "Fabrication of MEMS Devices by Using Anhydrous HF Gas-phase Etching With Alcoholic Vapor", Journal of Micromechanics and Microengineering, 12, 2002, pp. 297-306; K. Shimaoka, J. Sakata, "A New Full-Dry Processing Method for MEMS", R&D Review of Toyota CRDL Vol. 37 No. 3, September 2002, pp. 59-66; M. A. Lester, "Selective Material Removal for Nanostructure Formation", Semiconductor International, Jun. 1, 2003.

Figure 4:
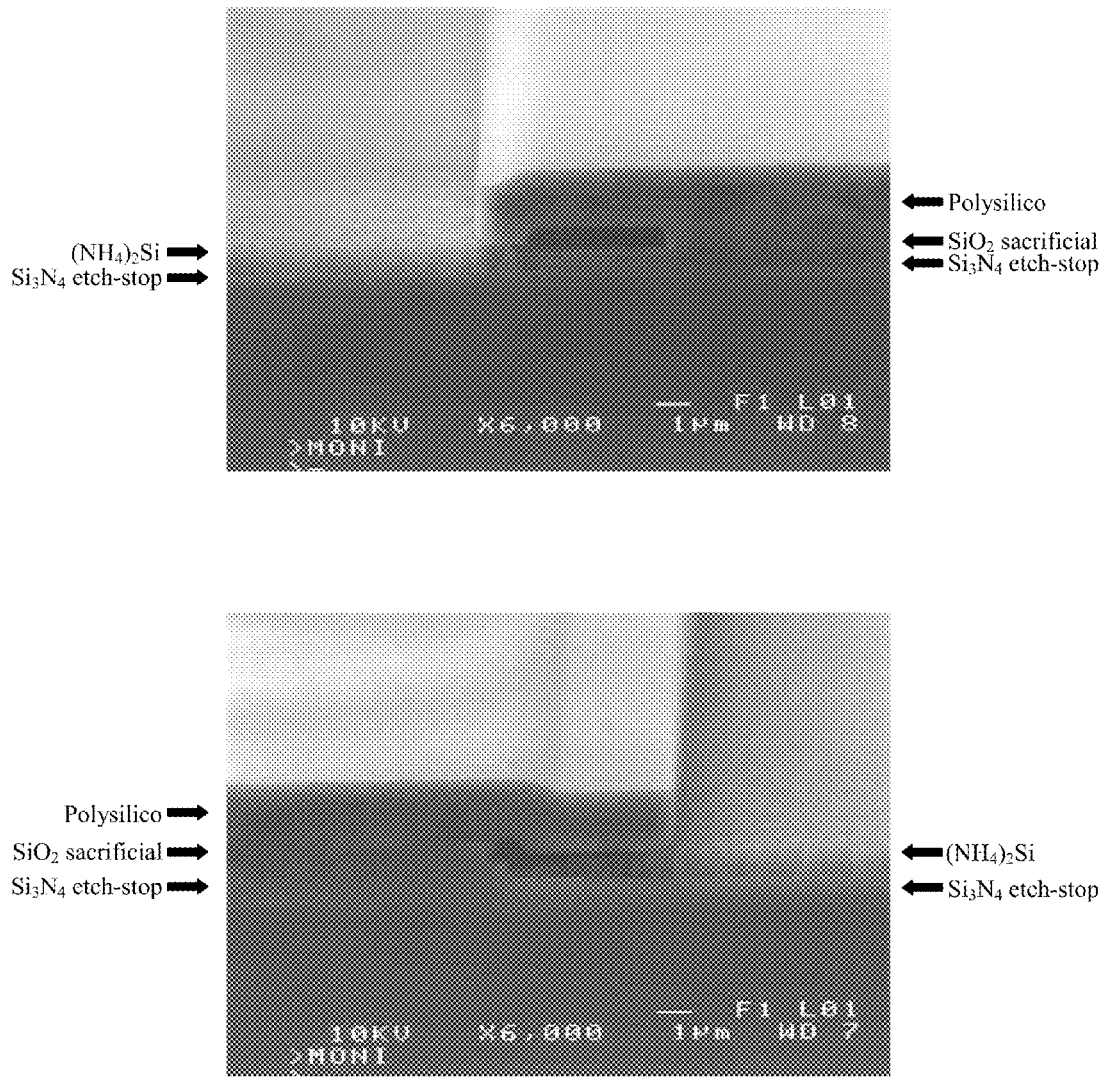
FIG. 4 shows Secondary Emission Microscopy, SEM, pictures of the chemical attack of silicon nitride by anhydrous HF.

FIG. 4 shows Secondary Emission Microscopy, SEM, pictures of the chemical attack of silicon nitride by anhydrous HF. In these SEM pictures the silicon nitride layer was used as an etch-stop layer underneath a sacrificial layer of silicon oxide.

Figure 5:
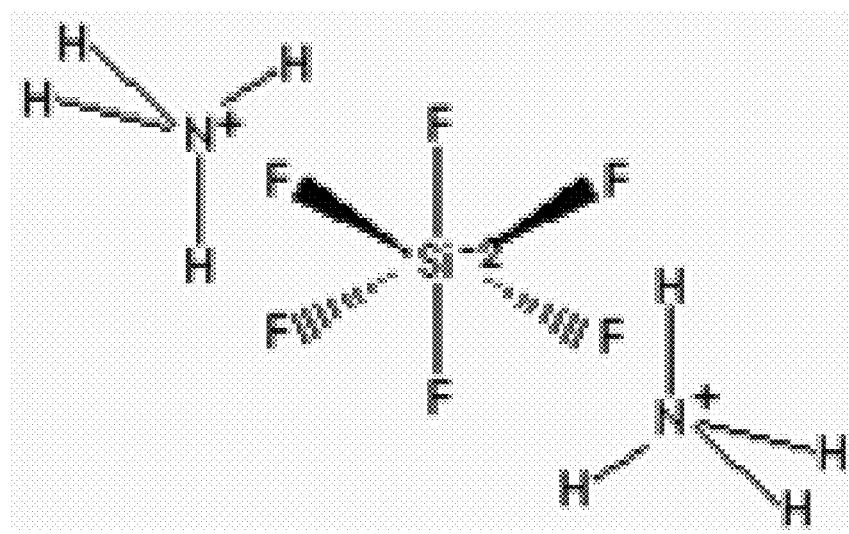
FIG. 5 shows the chemical structure of the ammonium fluorosilicate, $(NH_4)_2SiF_6$, compound resulting from the chemical attack of silicon nitride by anhydrous HF.

FIG. 5 shows the chemical structure of the ammonium fluorosilicate, $(NH_4)_2SiF_6$, compound resulting from the chemical attack of silicon nitride by anhydrous HF. Ammonium fluorosilicate is also known as ammonium fluorosilicate, ammonium hexafluorosilicate, ammonium silicofluoride, bararite, cryptohalite, cryptophthalite, and diammonium hexafluorosilicate.

It is known from the Material Safety Data Sheet of ammonium fluorosilicate, $(NH_4)_2SiF_6(s)$ ("MSDS of Ammonium Fluorosilicate", LCI, Ltd., P.O. Box 49000, Jacksonville Beach, Fla. 32240-9000) that the formed ammonium fluorosilicate, $(NH_4)_2SiF_6(s)$, is thermally unstable and experiences a thermal decomposition which provoke the evaporation of gas phase silicon tetrafluoride, $SiF_4(g)\uparrow$, and gas phase ammonia, $NH_3(g)\uparrow$, and results in the formation of an ammonium bifluoride, $NH_4HF_2(s)$, surface at a temperature of more than 100° C.:

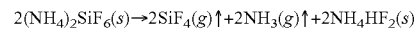

$$2(NH_4)_2SiF_6(s)\rightarrow 2SiF_4(g)\uparrow +2NH_3(g)\uparrow +2NH_4HF_2(s)$$

Figure 6:
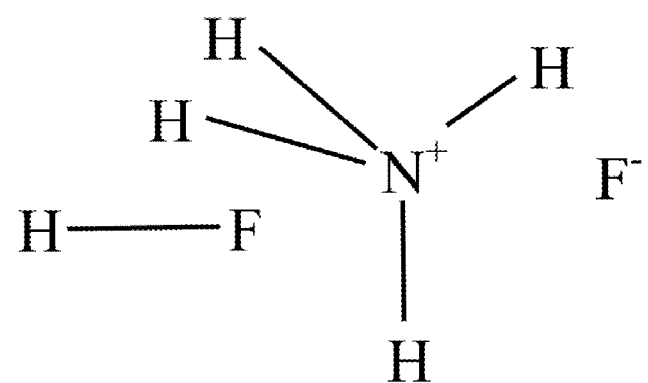
FIG. 6 shows the ammonium bifluoride, $NH_4HF_2$(CAS No. 1341-49-7), product resulting from this thermal decomposition.

FIG. 6 shows the ammonium bifluoride, $NH_4HF_2$(CAS No. 1341-49-7), product resulting from this thermal decomposition. Ammonium bifluoride is also known as: acid ammonium fluoride, ammonium acid fluoride, ammoniumbifluoride, ammonium difluoride, ammonium fluoride, ammonium hydrofluoride, ammonium hydrogen bifluoride, ammonium hydrogen difluoride, ammonium hydrogen fluoride, ammonium monohydrogen difluoride, and flammon crystals.

It is also known from the Material Safety Data Sheet of ammonium bifluoride, $NH_4HF_2(s)$) MSDS of Ammonium Bifluoride", Ampex Chemicals, S.A. de C.V.) that the formed ammonium bifluoride, $NH_4HF_2(s)$, surface has a melting point of 124.6° C. and a boiling point of 240° C. at atmospheric pressure.

FIG. 7 shows a top view optical pictures of a MEMS device released by removing the sacrificial oxide using the anhydrous HF release process. The top picture shows a region located over the etch-stop silicon nitride following exposure to the anhydrous HF release process while the bottom picture shows a region of the same device also located over the etch-stop silicon nitride also following an exposure to the anhydrous HF release process but following an evaporation of the produced ammonium fluorosilicate under nitrogen ambient at a temperature of more than 240° C. at atmospheric pressure. These optical photographs clearly show how efficient is the evaporation.

Figure 8:
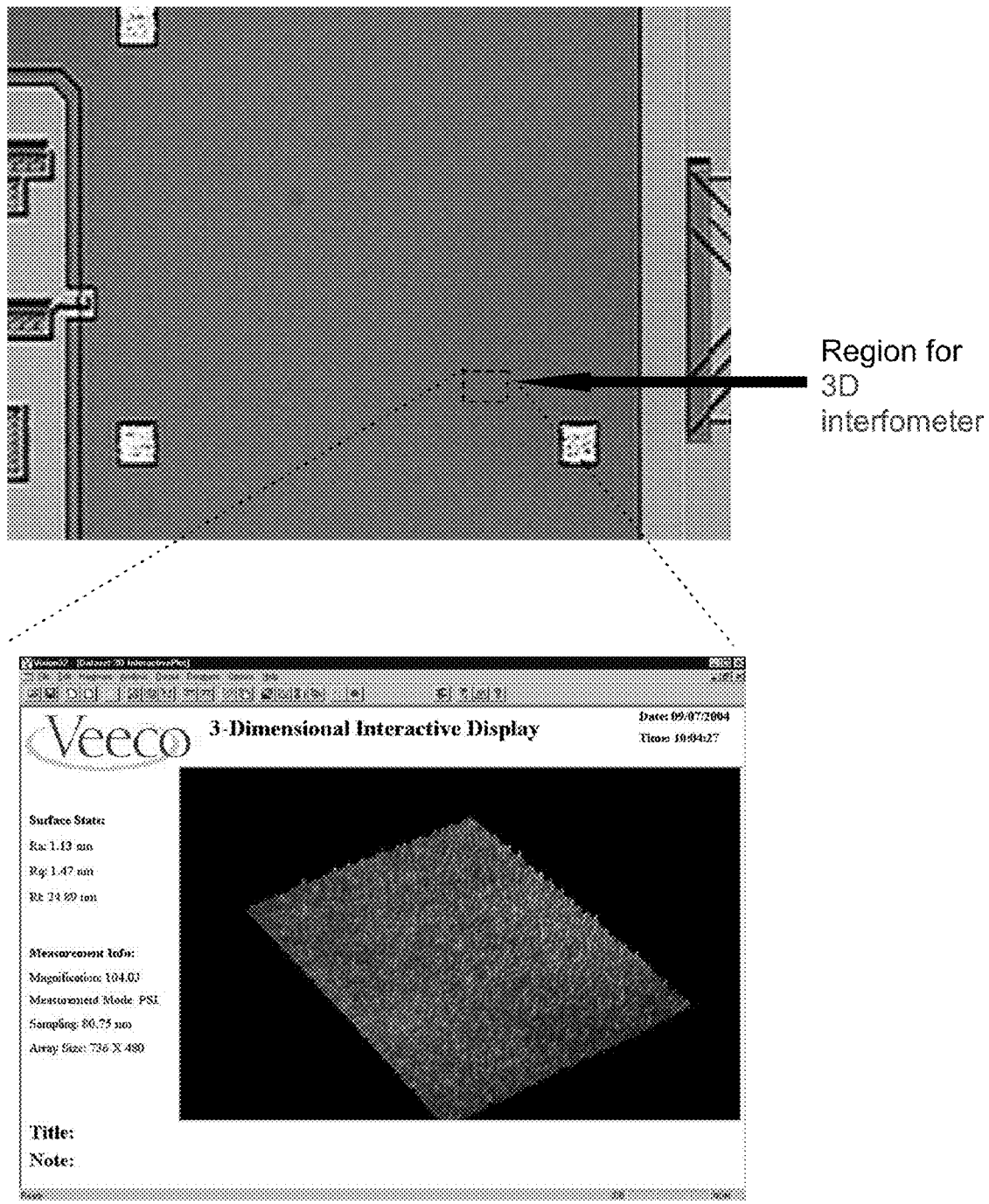
FIG. 8 shows a top view optical picture of the region of the silicon nitride of a MEMS device which had its mechanical structure released by removing the sacrificial oxide using the anhydrous HF release process.

FIG. 8 shows a top view optical picture of the region of the silicon nitride of a MEMS device which had its mechanical structure released by removing the sacrificial oxide using the anhydrous HF release process and which had the ammonium fluorosilicate evaporated under nitrogen ambient at a temperature of more than 240° C. at atmospheric pressure. The top view optical picture points the region of silicon nitride that has been attacked by the anhydrous HF release process and that has been cleared from its ammonium fluorosilicate following the evaporation under nitrogen ambient at a temperature of more than 240° C. at atmospheric pressure. The residual surface roughness of this same region is analyzed using white light 3D interferometry nanoimaging as to provide information about the residual topography following the evaporation of the ammonium fluorosilicate, $(NH_4)_2SiF_6$. The white light 3D interferometry nanoimaging clearly shows a very impressive smooth surface with a residual RMS (Rq) surface roughness of only 1.47 nm or about 7 atomic layers.

Figure 14:
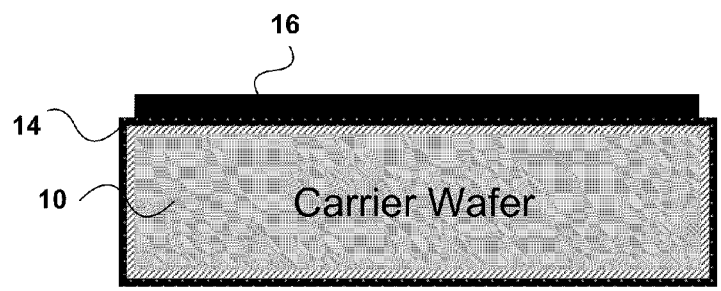
FIG. 14 shows a 20 μm thick layer of photopolymer applied by spinning onto the exposed layer of ammonium fluorosilicate.

The paper by B. Du Bois, G. Vereecke, A. Wltvrouw, P. De Moor, C. Van Hoof, A. De Caussemaeker, A. Verbist, "HF Etching of Si-oxides and Si-nitrides for Surface Micromachining", IMEC, Kapeldreef 75, B-3001 Leuven, Belgium, IST Project SUMICAP (IST-1999-10620) gives an estimated phase diagram for ammonium bifluoride, $NH_4HF_2$. FIG. 14 shows a re-sketch of the proposed ammonium bifluoride, $NH_4HF_2$, phase diagram with an emphasis on the location of the triple point, i.e. the pressure and temperature at which the solid, liquid and gas phases of ammonium bifluoride, $NH_4HF_2$ coexist. This estimated location of the triple point predicts which conditions of vacuum and pressure should be used to allow the sublimation of ammonium bifluoride, without any intermediate liquid phase formation.

FIG. 9 estimates that the complete sublimation of ammonium fluorosilicate, $(NH_4)_2SiF_6(g)\uparrow$, and ammonium bifluoride, $NH_4HF_2(g)\uparrow$, is possible without liquid phase formation at a pressure of less than the ammonium bifluoride triple point pressure of about 40 Torr if the temperature is higher than the ammonium bifluoride sublimation temperature and if the temperature is higher than the ammonium fluorosilicate sublimation temperature:

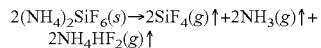

FIG. 9 shows that an anhydrous HF release process operating at a pressure of less than the ammonium bifluoride triple point pressure of about 40 Torr and at the temperature of the highlighted grey zone of FIG. 9 could result in a complete sublimation of ammonium fluorosilicate and ammonium bifluoride resulting from the exposure of silicon nitride to anhydrous HF.

FIG. 10 shows a picture of an array of microchannels produced in accordance with embodiments of the present invention.

The series of FIG. 11 to FIG. 25 form a schematic representation of the process flow used to produce these microchannels:

FIG. 11 shows the silicon wafer used as carrier wafer substrate 10. As shown in FIG. 12, a layer of silicon nitride 12 is deposited onto the carrier wafer 10 prior to exposure to anhydrous HF.

Figure 13:
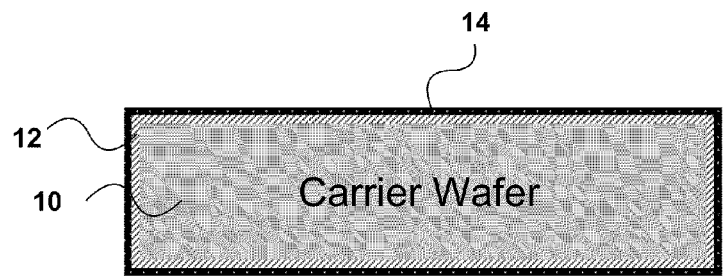
FIG. 13 shows the chemical conversion of the external surface of silicon nitride into ammonium fluorosilicate following its exposure to anhydrous HF.

The external surface 14 of the silicon nitride layer 12 is then converted into ammonium fluorosilicate following its exposure to anhydrous HF as shown in FIG. 13

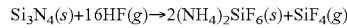

The thickness of silicon nitride and the anhydrous HF exposure are such that only a portion of the total thickness of silicon nitride is converted to ammonium fluorosilicate, thus leaving a residual underlayer of silicon nitride 12.

Figure 15:
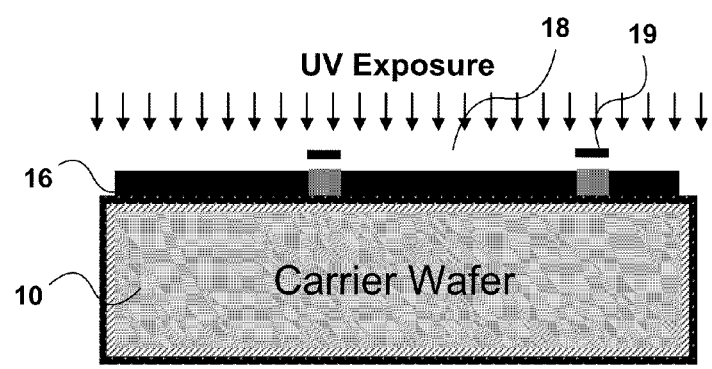
FIG. 15 shows this 20 μm thick layer of photopolymer exposed to ultraviolet light through the openings of the mask defining the shape of the cover of the microchannel.

A 20 μm thick layer of photopolymer 16 is applied by spinning onto the exposed layer of ammonium fluorosilicate as shown in FIG. 14. The thickness of this first layer is adjusted in such a way that it will be strong enough to be used as cover of the microchannel. Following proper dispense, spinning and solidification by partial solvents evaporation, the dried photopolymer is subjected to a pre-exposure bake not exceeding 95° C. as to drive-off more of its residual solvents in preparation for the exposure to ultra-violet light through a properly designed mask;

FIG. 15 shows that this 20 um thick layer of photopolymer is exposed to ultraviolet light through the openings 18 of a mask 19 defining the shape of the cover of the microchannel. Being of negative tone, the photopolymer will reticulate in the regions exposed to the ultraviolet light and will locally become resistant to the chemical attack of the developer to be used later in the process. Following ultraviolet light exposure for an optimized dose, this first layer of a thick negative tone photopolymer is subjected to a post-exposure bake again not exceeding 95° C. to drive-off more of the residual solvents and the chemical by-products formed by the ultra-violet light exposure.

Figure 16:
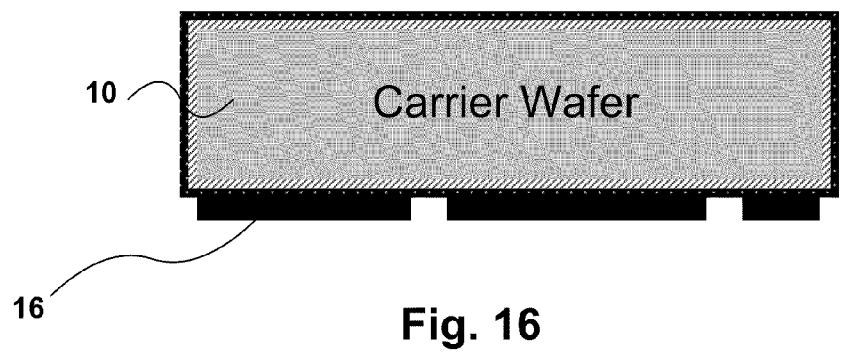
FIG. 16 shows this 20 um thick layer of photopolymer developed, thus defining the cover of the microchannel.
Figure 17:
FIG. 17 shows the silicon wafer used as device wafer substrate.
Figure 18:
FIG. 18 shows a 10 um thick layer of photopolymer applied by spinning.
Figure 19:
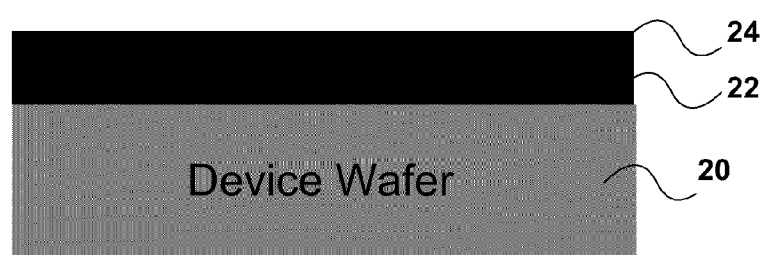
FIG. 19 shows a second layer of a 10 um thick negative tone photopolymer applied by spinning onto the exposed first layer of a thick negative tone photopolymer.
Figure 20:
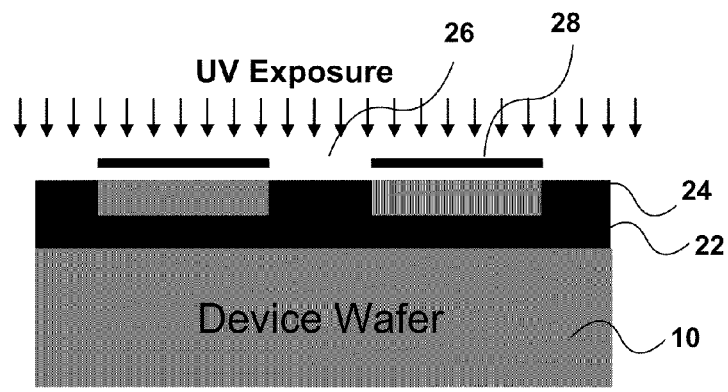
FIG. 20 shows this second layer of 10 um thick negative tone photopolymer exposed to ultraviolet light through the openings of the mask.
Figure 21:
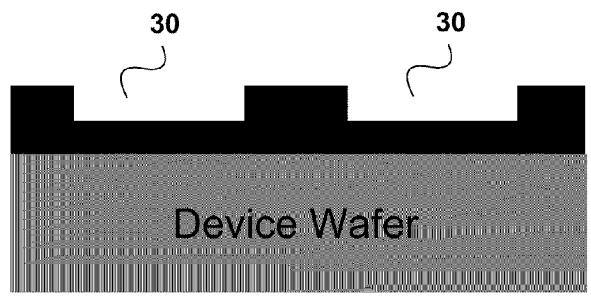
FIG. 21 shows this second layer of a properly exposed 10 um thick negative tone photopolymer developed into a proper developer, thus defining the shape of the microchannels.

FIG. 16 shows that this 20 μm thick layer of photopolymer is developed, thus defining the cover of the microchannel. The regions of the photopolymer that have being exposed to the ultraviolet light passing through the openings of the mask remain intact because resistant to the chemical attack of the developer. Following suitable development of the photopolymer, the resulting photopolymer patterns are subjected to a post-develop bake again not exceeding 95° C. to drive-off more of the residual solvents and the chemical by-products formed by the ultra-violet light exposure and by the develop. At this point, the developed and baked photopolymer patterns of the carrier wafer are ready to be aligned to the device Wafer;

FIG. 17 shows the silicon wafer used as device wafer substrate 20. A 10 μm thick layer of photopolymer 22 is applied by spinning as shown in FIG. 18. This layer is to become the bottom of the microchannel. Following proper dispense, spinning and solidification by partial solvents evaporation, the dried photopolymer is subjected to a high temperature bake as to drive-off its residual solvents and as to allow the photopolymer to be stabilized i.e. to become chemically stable when an upper layer of photopolymer will be spin-on and exposed in a further step;

FIG. 19 shows that a second layer 24 of a 10 μm thick negative tone photopolymer is applied by spinning onto the exposed first layer 22 of a thick negative tone photopolymer. This second layer 24 is to become the sidewall of the microchannel. The thickness of this second layer is adjusted in such a way that it will form a tall enough microchannel confined between the already stabilized bottom layer of the Device Wafer and the top layer yet to be transferred from the Carrier Wafer. Following proper dispense, spinning and solidification by partial solvents evaporation, the dried photopolymer is subjected to a pre-exposure bake not exceeding 95° C. to drive-off more of its residual solvents in preparation for the exposure to ultra-violet light through a properly designed mask;

FIG. 20 shows that this second layer 24 of a 10 μm thick negative tone photopolymer is exposed to ultraviolet light through the openings 26 of the mask 28. Being of negative tone, the photopolymer will reticulate in the regions exposed to the ultraviolet light and will locally become resistant to the chemical attack of the developer to be used later in the process. Following ultraviolet light exposure for an optimized dose, this second layer of a thick negative tone photopolymer is subjected to a post-exposure bake again NOT exceeding 95° C. to drive-off more solvents and chemical by-products formed by the ultra-violet light exposure;

FIG. 21 shows that this second layer of a properly exposed 10 um thick negative tone photopolymer is developed into a proper developer, thus defining the shape of the microchannels 30. The regions of the photopolymer that have being exposed to the ultraviolet light passing through the openings of the mask remain intact because they are resistant to the chemical attack of the developer. Following suitable development of the photopolymer, the resulting photopolymer patterns are subjected to a post-develop bake again not exceeding 95° C. as to drive-off more of the residual solvents and the chemical by-products formed by the ultra-violet light exposure and by the develop. At this point, the developed and baked photopolymer patterns of the Device Wafer are ready to be aligned and to receive the transferred top photopolymer layer of the carrier wafer 10.

Figure 22:
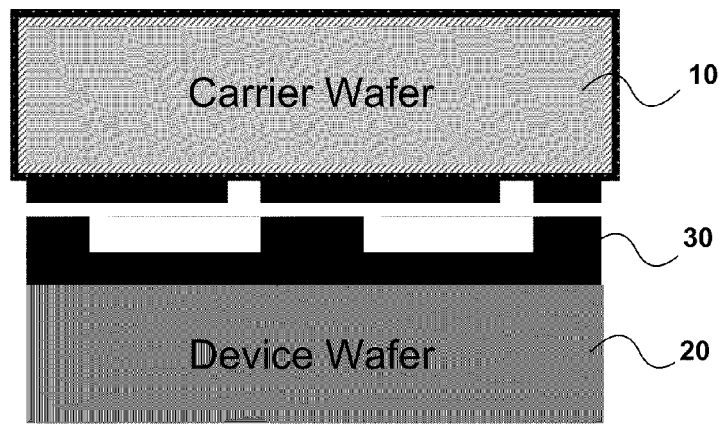
FIG. 22 shows that the carrier wafer supporting the developed and baked photopolymer patterns defining the cover of the microchannel flipped-over and properly aligned to the Device Wafer integrating the sidewall and bottom of the microchannel.
Figure 23:
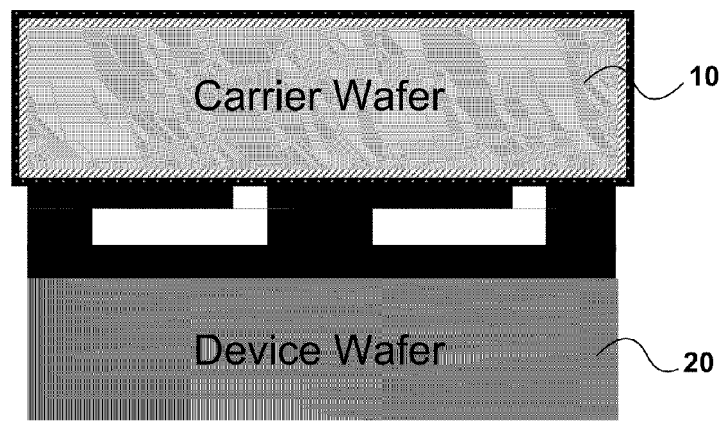
FIG. 23 shows the pair of properly aligned wafers that loaded into the wafer bonding equipment.

FIG. 22 shows that the carrier wafer 10 supporting the developed and baked photopolymer patterns defining the cover of the microchannel is flipped-over and properly aligned to the device wafer 20 integrating the sidewall and bottom of the microchannels 30. The precise alignment is such that the aligned wafers, not yet in physical contact, are kept in position using a special fixture in preparation for loading of the pair of wafers into a wafer bonding equipment;

FIG. 23 shows that the pair of properly aligned wafers as loaded into the wafer bonding equipment that allows these to become in physical contact by pressing one against the other (without losing alignment accuracy). The pair of wafers is then heated, under vacuum, to a temperature not exceeding 95° C. while maintaining the two wafers under intimate contact, as to provoke the bonding of the photopolymer of the carrier wafer to the exposed photopolymer of the device wafer 20. Following proper baking at a temperature not exceeding 95° C. while maintaining the two wafers under intimate contact, the pair of wafers is unloaded from the wafer bonding equipment.

Figure 24:
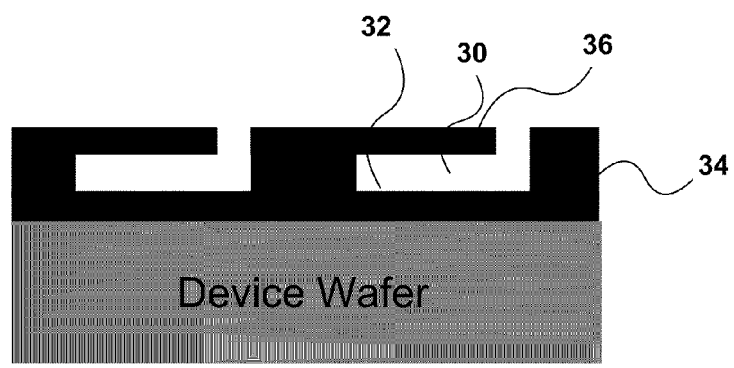
FIG. 24 shows the pair of bonded wafers heated to a temperature exceeding 125° C. as to decompose the thermally unstable ammonium fluorosilicate.

FIG. 24 shows the pair of bonded wafers after heating to a temperature exceeding 125° C. to decompose the thermally unstable ammonium fluorosilicate, $(NH_4)_2SiF_6(s)$, of the carrier wafer 10 which provokes the sudden formation and evaporation of volatile silicon tetrafluoride, $SiF_4(g)\uparrow$, and volatile ammonia, $NH_3(g)\uparrow$, and which results in the formation of a residual ammonium bifluoride, $NH_4HF_2(s)$, surface on the carrier wafer:

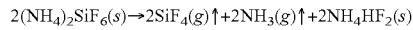

$$2(NH_4)_2SiF_6(s) \rightarrow 2SiF_4(g)\uparrow + 2NH_3(g)\uparrow + 2NH_4HF_2(s)$$

and the sublimation of this ammonium bifluoride, $NH_4HF_2(s)$, into volatile ammonia, $NH_3(g)\uparrow$, and hydrofluoric acid, $HF(g)\uparrow$. This sudden gas formation results in a mechanical release of the carrier wafer from the device wafer that can now be separated at that temperature. The result is a microchannel 30 having a bottom layer 32, a sidewall layer 34 and a top layer 36.

Figure 25:
FIG. 25 shows that the device wafer now incorporating the microchannel heated under vacuum at more then 200° C. to chemically stabilize the photopolymer and to achieve a solid permanent microchannel.

FIG. 25 shows the device wafer 20 now incorporating the microchannel heated under vacuum at more than 200° C. to chemically stabilize the photopolymer and achieve a solid permanent microchannel.

Figure 26:
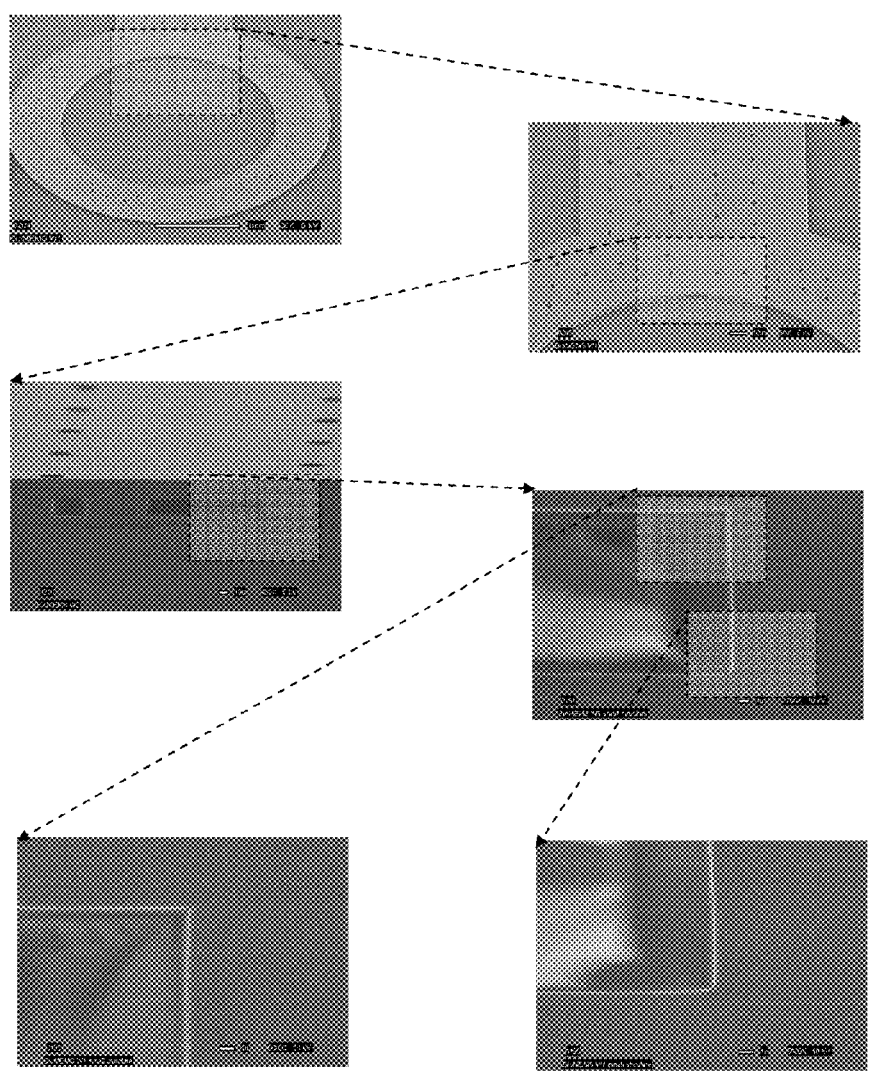
FIG. 26 shows a series of SEM pictures of a Device Wafer integrating the obtained microchannel.

FIG. 26 shows a series of SEM pictures of a Device Wafer integrating the obtained microchannel. The detailed pictures show that there is a seamless fusion of the bottom, the sidewall and the cover of the microchannel.

This silicon wafer used as the carrier substrate shown in FIG. 11 is preferably a SEMI standard 150 mm diameter silicon wafer, but could also, e.g., be a 100 mm diameter, a 200 mm diameter or a 300 mm diameter silicon wafer.

The silicon nitride, $Si_3N_4$, deposited onto the silicon Carrier Wafer prior to exposure to anhydrous hydrofluoric acid, HF can be conveniently deposited using a Bruce/Kokusai Low Pressure Chemical Vapour Deposition, LPCVD, horizontal furnace such at a preferable temperature of about 830° C., preferably using a mixture of dichlorisilane, $SiH_2Cl_2$ and ammonia, $NH_3$, as to preferably produce a 0.3 um thick layer of silicon nitride. This silicon layer could also be deposited at other temperatures ranging from 750° C. to 900° C. and at other thicknesses ranging from 0.05 um to 1.0 um. This silicon layer could also be deposited using LPCVD in a vertical LPCVD furnace. This silicon layer could also be deposited at a much lower temperature ranging from 200° C. to 500° C. with a Plasma Enhanced Chemical Vapour Deposition, PECVD, equipment using mixtures of silane, $SiH_4$ and ammonia, $NH_3$. In that case, the silicon nitride would be a hydrogenated PECVD silicon nitride layer.

The layer 14 of silicon nitride converted into ammonium fluorosilicate, $(NH_4)_2SiF_6$, following its exposure to anhydrous hydrofluoric acid, HF, under a controlled sub-atmospheric pressure of anhydrous HF is preferably 0.1 µm thick. The preferably 0.3 µm thick initial layer of silicon nitride and the preferable anhydrous HF exposure are such that only the external 0.1 µm of the preferably 0.3 µm thick silicon nitride is converted to ammonium fluorosilicate by releasing volatile silicon tetrafluoride, $SiF_4$, while leaving a residual underlayer of silicon nitride;

$$Si_3N_4(s) + 16HF(g) \rightarrow 2(NH_4)_2SiF_6(s) + SiF_4(g)\uparrow$$

This controlled sub-atmospheric conversion process using anhydrous HF is performed at preferably 70 Torr of anhydrous HF in a Primaxx specialized anhydrous HF processor. Following this surface conversion, the anhydrous HF is stopped and the wafers are exposed to nitrogen ambient before being manipulated under atmospheric conditions to the next step of the process. This silicon nitride layer could also be converted in other known types of equipment suitable for this purpose. This silicon nitride layer could also be converted at a pressure ranging between 10 and 750 Torr. This silicon nitride layer could also be converted in gas mixtures involving anhydrous HF and an organic volatile, such as: methanol, acetone, 1-buthanol, 2-buthanol, 1-propanol or 2-propanol. Finally, this silicon nitride layer could also be converted in gas mixtures involving anhydrous HF, nitrogen and solvents or alcohols such as methanol, acetone, 1-buthanol, 2-buthanol, 1-propanol or 2-propanol.

The thick layer of a negative tone photopolymer 16 shown in FIG. 14 is preferably 20 µm thick and applied by spinning onto the exposed layer of ammonium fluorosilicate. Such a preferred photopolymer is SU-8, a negative tone epoxy-like near-UV photoresist originally developed, and described in U.S. Pat. No. 4,882,245 entitled: 'Photoresist Composition and Printed Circuit Boards and Packages Made Therewith'

This high performance photopolymer is available from three companies: MicroChem Corporation, a company previously named Microlithography Chemical Corporation, of Newton, Mass., USA. The photopolymer is sold under the name NANO SU-8 at different viscosities: SU-82005; SU-82010; SU-82025; SU-82050; SU-82100; Gerstel Ltd, a company previously named SOTEC Microsystems, of Pully, Switzerland. The photopolymer is sold under the name GM or GLM at different viscosities: GM1040; GM1060; GM1070, GLM2060, GLM3060; and Kayaku Microchem Corporation (KMCC), of Chiyoda-Ku, Tokyo, Japan. The photopolymer is sold under the name XP KMPR-1000 SU8 at different viscosities: XP KMPR-1005; XP KMPR-1010; XP KMPR-1025; XP KMPR-1050; XP KMPR-1100;

This high performance photopolymer can be spin coated using one of the two coat stations of an EV Group Hercules processor. About 3 ml of Microchem SU-82025 photopolymer solution is dispensed above the 150 mm wafer before spinning at about 1600 RPM as to dry the spin-on photopolymer by partial solvents evaporation and as to achieve a film thickness of preferably 20 um to be strong enough to become the protection capsule. The dried photopolymer is subjected to a pre-exposure bake not exceeding 95° C. and for about 8 to 10 minutes as to drive-off more of its residual solvents. This MicroChem SU-82025 negative tone photopolymer can alternately be replaced by the Gerstel GM 1060 or GLM2060 negative tone photopolymer or by the Kayaku Microchem XP KMPR 1025 negative tone photopolymer to achieve the same preferred thickness of 20 um. The viscosity of the photopolymer solution could be lower then the one of the Microchem SU-8 2025 photopolymer solution as to reduce the thickness of this first layer of negative tone photopolymer from 40 um down to about 5 um. In that case, the Microchem SU-82005 or SU-82010 negative tone photopolymer solution could be used, the Gerstel GM 1040 negative tone photopolymer solution could be used, or the Kayaku Microchem XP KMPR 1005 or XP KMPR-1010 negative tone photopolymer solution could be used. Alternately, the viscosity of the photopolymer solution could be higher then the one of the MicroChem SU-82025 photopolymer solution as to increase the thickness of this first layer of negative tone photopolymer from 20 um up to about 500 um. In that case, the Microchem SU-82050 or SU-82100 negative tone photopolymer solution could be used, the Gerstel GM 1070 negative tone photopolymer solution could be used, or the Kayaku Microchem XP KMPR 1050 or XP KMPR-1100 negative tone photopolymer solution could be used. To thicker negative tone photopolymer layers should be associated a longer than 90 seconds pre-exposure bake but still not exceeding 95° C. and for about as to drive-off the residual solvents.

The preferably 20 um thick layer of negative tone photopolymer is exposed, a shown in FIG. 15, using a highly collimated broadband UV source (g-line, h-line and l-line) of the EV Group Hercules processor through the openings of the mask defining the shape of the protection capsule. Being of negative tone, the photopolymer will reticulate in the regions exposed to the ultraviolet light and will locally become resistant to the chemical attack of the developer to be used later in the process. Following ultraviolet light exposure for an optimized dose of about 180 mJ/cm$^2$, this first layer of a thick negative tone photopolymer is subjected to a 5 minutes duration post-exposure bake again not exceeding 95° C. as to drive-off more of the residual solvents and the chemical by-products formed by the ultra-violet light exposure. At this point, the exposed photopolymer is not yet developed.

If this MicroChem SU-82025, Gerstel GM 1060 or GLM2060 or Kayaku Microchem XP KMPR 1025 negative tone photopolymer is replaced by a lower viscosity solution such as the Microchem SU-82005 or SU-82010, the Gerstel GM 1040 or the Kayaku Microchem XP KMPR 1005 or XP KMPR-1010 negative tone photopolymer solution, then the optimized dose would be lower than about 310 mJ/cm$^2$, to prevent over-exposure of this first layer of a negative tone photopolymer. Alternatively, if this MicroChem SU-82025, Gerstel GM 1060 or GM 2060 or Kayaku Microchem XP KMPR 1025 negative tone photopolymer is replaced by a higher viscosity solution such as the Microchem SU-82050 or SU-82100, the Gerstel GM 1070 or the Kayaku Microchem XP KMPR 1050 or XP KMPR-1100 negative tone photopolymer solution, then the optimized dose would be higher than about 310 mJ/cm$^2$, to prevent under-exposure of this first layer of a negative tone photopolymer. Thicker negative tone photopolymer layers are associated with a longer than 90 seconds post-exposure bake but still not exceeding 95° C.

The preferably 20 μm thick layer of MicroChem SU-82025 negative tone photopolymer is developed using one of the two develop stations of the EV Group Hercules processor to define an array of covers to be transferred onto the array of microchannels of another substrate. The regions of the photopolymer that have been exposed to the ultraviolet light passing through the openings of the mask remain intact because resistant to the chemical attack of the developer. This layer of negative tone photopolymers is capable of achieving complex structures and mechanical features having a height: width aspect ratio as high as 10:1.

FIG. 17 shows the silicon wafer used as the device wafer substrate 20. This silicon wafer is preferably a SEMI standard 150 mm diameter silicon wafer but could also, for example, be a 100 mm diameter, a 200 mm diameter or a 300 mm diameter silicon wafer;

FIG. 18 shows that a first layer of a preferably 10 um thick layer negative tone photopolymer applied by spinning. This first layer is to become an array of bottoms of the array of microchannels. This negative tone photopolymer is spin coated using one of the two coat stations of the EV Group Hercules processor. Again, about 3 ml of Microchem SU-82005 is dispensed above the 150 mm wafer before spinning at about 1600 RPM to dry the spin-on photopolymer by partial solvents evaporation and to achieve a film thickness of preferably 10 μm. The dried photopolymer is subjected to a pre-exposure bake not exceeding 95° C. and for about 5 minutes as to drive-off more of its residual solvents.

This MicroChem SU-82005 negative tone photopolymer can alternately be replaced by the MicroChem SU-82010, the Gerstel GM 1040 or the Kayaku Microchem XP KMPR 1005 or XP KMPR 1010 negative tone photopolymer to achieve the same preferred thickness of 10 μm. The viscosity of the photopolymer solution could be higher than the one of the MicroChem SU-82005 photopolymer solution to increase its thickness above 10 μm. In that case, the Microchem SU-82025 or SU-82050 or SU-82100, the Gerstel GM 1060, GM 1070 or GM 2060 or the Kayaku Microchem XP KMPR 1025, XP KMPR 1050 or XP KMPR-1100 negative tone photopolymer solution could be used. Again, thicker negative tone photopolymer layers should be associated with a longer than 90 seconds pre-exposure bake at about 95° C. to drive-off more of the residual solvents. A vacuum bake at a temperature of about 180° C. is performed for about 2 hours to stabilize this first 10 um thick layer and prevent its photochemical activity when exposed to ultra-violet light.

The second layer 24 of a preferably 10 um thick negative tone photopolymer shown in FIG. 19 is applied by spinning onto the thermally stabilized 10 um thick negative tone photopolymer. Again, this high performance photopolymer is spin coated using one of the two coat stations of the EV Group Hercules processors. Again, about 3 ml of Microchem SU-82005 is dispensed above the 150 mm wafer before spinning at about 1600 RPM as to dry the spin-on photopolymer by partial solvents evaporation and as to achieve a 10 um thick film. The dried photopolymer is subjected to a pre-exposure bake not exceeding 95° C. and for about 5 minutes as to drive-off more of its residual solvents.

This MicroChem SU-82005 negative tone photopolymer can alternately be replaced by the MicroChem SU-82010, the Gerstel GM 1040 or the Kayaku Microchem XP KMPR 1005 or XP KMPR 1010 negative tone photopolymer to achieve the same preferred thickness of 10 μm. The viscosity of the photopolymer solution could be higher than the one of the MicroChem SU-82005 photopolymer solution to increase its thickness above 10 μm. In that case, the Microchem SU-82025 or SU-82050 or SU-82100, the Gerstel GM 1060, GM 1070 or GM 2060 or the Kayaku Microchem XP KMPR 1025, XP KMPR 1050 or XP KMPR-1100 negative tone photopolymer solution could be used. Again, to thicker negative tone photopolymer layers should be associated a longer than 90 seconds pre-exposure bake but still not exceeding 95° C. and for about as to drive-off more of its residual solvents in preparation for the exposure to ultra-violet light through a properly designed mask.

This second layer of a preferably 10 um thick MicroChem SU-82005 negative tone photopolymer is exposed, as shown in FIG. 20, using the highly collimated broadband UV source (g-line, h-line and I-line) of the EV Group Hercules processor through the openings of the mask defining the array of sidewalls of the array of microchannels. Being of negative tone, the photopolymer will reticulate in the regions exposed to the ultraviolet light and will locally become resistant to the chemical attack of the developer to be used later in the process. Following ultraviolet light exposure for an optimized dose of about 180 mJ/cm$^2$, this first layer of a thick negative tone photopolymer is subjected to a 3 minutes duration post-exposure bake again not exceeding 95° C. as to drive-off more of the residual solvents and the chemical by-products formed by the ultra-violet light exposure.

Again, if this MicroChem SU-82005 or SU-82010, this Gerstel GM 1040 or this Kayaku Microchem XP KMPR 1005 or XP KMPR 1010 negative tone photopolymer is replaced by a higher viscosity solution such as the Microchem SU-82025 or SU-8 2050 or SU-82100, the Gerstel GM 1060, GM 1070 or GM 2060 or the Kayaku Microchem XP KMPR 1025, XP KMPR 1050 or XP KMPR-1100 negative tone photopolymer solution, then the optimized dose would be higher than about 180 mJ/cm$^2$, to prevent under-exposure of this second layer of a negative tone photopolymer. Thicker negative tone photopolymer layers are associated a longer-than 90 seconds post-exposure bake but still not exceeding 95° C.

This second layer of a preferably 10 μm thick MicroChem SU-82005 negative tone photopolymer is developed, a shown in FIG. 16, using one of the two develop stations of the EV Group Hercules processor to define the defining the array of sidewalls of the array of microchannels. The regions of the photopolymer that have being exposed to the ultraviolet light passing through the openings of one or both of the masks remain intact because resistant to the chemical attack of the developer. These two layers of negative tone photopolymers are capable of achieving complex structures and mechanical features having a height:width aspect ratio as high as 10:1. Following suitable development of the photopolymer, the resulting photopolymer patterns are subjected to a post-develop bake at about 95° C. as to drive-off more of the residual solvents and the chemical by-products formed by the ultra-violet light exposure and by the develop. A vacuum bake at a temperature of about 180° C. is performed for about 2 hours to stabilize this exposed second 10 um thick layer. At this point, the developed and baked photopolymer patterns of the Device Wafer are ready to be aligned and to receive the transferred top photopolymer layer of the Carrier Wafer.

The carrier wafer 10 supporting the developed and baked photopolymer patterns defining the array of covers of the array of microchannels is flipped-over, as shown in FIG. 22, and properly aligned to the Device Wafer integrating the array of sidewalls and the array of bottoms of the array of microchannels using a SmartView aligner of the EV Group Gemini processor. The alignment is precise within about 1 μm. The aligned wafers, not yet in physical contact, are kept in position using a special fixture in preparation for loading of the pair of wafers into one of the four Universal bond chamber of the EV Group Gemini processor.

The pair of properly aligned wafers, shown in FIG. 23, are loaded into one of the four Universal bond chamber of the EV Group Gemini processor. This Universal bond chamber allows the carrier wafer and the device wafer to become in physical contact by slowly pressing one against the other (without losing alignment accuracy) with a uniform force of 5 kN to 20 kN while heating the two wafers at a temperature not exceeding 95° C. for about 20 minutes as to provoke the permanent bonding of the photopolymer of the carrier wafer to the exposed top bond material of the Device Wafer. Again, the precise alignment of about 1 μm achieved with the Smart-View is such that the thousands of protection capsules of the carrier wafer do not make a direct contact to the thousands of free-to-move mechanical devices of the device wafer during this bonding process. The bonded pair of wafers is unloaded from the universal bond chamber, cooled-down to room temperature using a cool station and returned in a properly designed receiving cassette.

The pair of bonded wafers is heated to a temperature exceeding 125° C. to decompose the thermally unstable ammonium fluorosilicate, $(NH_4)_2SiF_6(s)$, of the carrier wafer which provokes the sudden formation and evaporation of volatile silicon tetrafluoride, $SiF_4(g)\uparrow$, and volatile ammonia, $NH_3(g)\uparrow$, and which results in the formation of a residual ammonium bifluoride, $NH_4HF_2(s)$, surface on the carrier wafer:

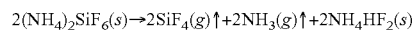

and the sublimation of this ammonium bifluoride, $NH_4HF_2(s)$, into volatile ammonia, $NH_3(g)\uparrow$, and hydrofluoric acid, $HF(g)\uparrow$. This sudden gas formation results in a mechanical release of the carrier wafer from the device wafer that can now be separated at that temperature. The result is a microchannel composed of a bottom layer, a sidewall layer and a top layer.

Embodiments of the present invention thus provide a simple, inexpensive, high precision, gold-free, sodium-free and potassium-free process allowing the formation, at a temperature of less than 250° C., of hundreds if not thousands of microfluidics microchannels on a CMOS wafer integrating hundreds if not thousands of digital and/or analog CMOS control logic and/or high voltage CMOS drivers capable of performing sensing and/or microfluidics actuation functions.

Many variants of the invention are possible. For example, the carrier wafer ma be a silicon carrier wafer, a glass carrier wafer, a compound semiconductor carrier wafer, a ceramic carrier wafer, or a metal carrier wafer.

The silicon nitride may be deposited by Low Pressure Chemical Vapour Deposition, LPCVD in a horizontal or vertical furnace at a temperature ranging from 750° C. to 900° C., preferably about 830° C.

The LPCVD silicon nitride may be deposited using a mixture of dichlorisilane, $SiH_2Cl_2$ and ammonia, $NH_3$ at a thickness ranging from 0.05 μm to 1.0 μm, preferably about 0.3 μm.

The silicon nitride could also be deposited by Plasma Enhanced Chemical Vapour Deposition, PECVD in either batch equipment or single wafer equipment at a temperature ranging from 200° C. to 500° C., preferably about 400° C. using a mixture of silane, $SiH_4$ and ammonia, $NH_3$.

The PECVD silicon nitride is deposited at a thickness ranging from 0.05 μm to 1.0 μm, preferably about 0.3 um.

The anhydrous HF process is preferably performed in a sub-atmospheric pressure of anhydrous HF at a pressure ranging from 10 to 750 Torr, preferably about 70 Torr, in a mixture of anhydrous HF and an organic volatile, such as methanol, acetone, 1-buthanol, 2-buthanol, 1-propanol or 2-propanol.

The broadband UV source used to expose the polymers should be highly collimated to achieve high aspect ratio features.

The second exposed and heat treated photopolymer can be developed to form a spacer ring for the device, or the first and second exposed and heat treated photopolymers can be developed together as to simultaneously form a protection capsule underlying a spacer ring.

The device wafer may contain CMOS devices.

The bonding of the structures can be performed by applying a force from 5 kN to 20 kN. The applied force of 5 kN to 20 kN should be applied to the effective surface area of the full 150 mm wafers (175 cm$^2$), thus resulting in an effective applied pressure of 0.5 MPa to 1.1 MPa.

The applied force of 5 kN to 20 kN should be applied to the effective surface area of the thousands of protection capsules, representing about 20% of the area of the full 150 mm wafers (35 cm$^2$), thus resulting in an effective applied pressure of 1.4 MPa to 7 MPa.

The applied force of 5 kN to 20 kN should be applied to the effective surface area of the thousands of sidewalls underneath the thousands of covers, representing about 4% of the area of the full 150 mm wafers (7.0 cm$^2$), thus resulting in an effective applied pressure of 6.7 MPa to 29 MPa.

The heating of the wafers should be performed for about 20 minutes to produce a permanent bond between the contacted photopolymer of the carrier wafer to the exposed top bond material of the device wafer.

The separation of the wafers may take place outside the vacuum environment at a temperature exceeding 125° C.

The separated device wafer may be exposed to a vacuum lower than 100 Pa at a temperature of up to 200° C. for up to four hours to polymerize the formed microchannels and convert them into hard and very adherent epoxy-like microchannels.

All references referred to herein are herein incorporated by reference.

We claim:

1. A method of making a MEMS device, comprising:
   depositing a silicon nitride layer on a carrier wafer;
   chemically modifying said silicon nitride layer by exposure to anhydrous hydrofluoric acid to form a modified surface layer subject to thermal decomposition into gaseous by-products;
   forming a patterned first photopolymer layer on said modified surface layer;
   forming a patterned second photopolymer layer on a device wafer;
   bonding the patterned first and second photopolymer layers of the carrier wafer and the device wafer together to form an integrated device by applying heat and pressure; and
   applying heat to decompose said modified surface layer and thereby separate the carrier wafer from the device wafer.

2. A method as claimed in claim 1, wherein said carrier wafer and device wafer are silicon wafers.

3. A method as claimed in claim 1, wherein the silicon nitride layer is deposited by low pressure chemical vapor deposition at a temperature in a range from 750 to 900° C.

4. A method as claimed in claim 1, wherein said patterned first and second photopolymer layers comprise a negative tone photopolymer.

5. A method as claimed in claim 1, wherein said carrier and device wafers when bonded together form microchannels.

6. A method as claimed in claim 5, wherein the patterned first photopolymer layer on the carrier wafer forms a lid portion of said microchannels and said patterned second photopolymer layer on the device wafer forms a base of said microchannels.

7. A method as claimed in claim 1, wherein after separation of said carrier wafer and said device wafer, said bonded patterned first and second photopolymer layers are subjected to hardening treatment.

8. A method of forming a MEMS device containing microchannels, comprising:
   depositing a silicon nitride layer on a carrier wafer;
   modifying a surface portion of said silicon nitride layer by exposure to anhydrous hydrofluoric acid to form a modified surface layer;
   forming a patterned first photopolymer layer on said modified surface layer;
   forming a patterned second photopolymer layer on a device wafer;
   bonding said patterned first and second photopolymer layers together to form an integrated device containing the microchannels; and
   releasing said carrier wafer by heating said structures to decompose said modified surface layer.

9. A method as claimed in claim 8, wherein said patterned first photopolymer layer provides a lid portion of said microchannels, and said patterned second photopolymer layer provides a base portion of said microchannels.

10. A method as claimed in claim 8, wherein said patterned first and second photopolymer layers are stabilized by baking at a temperature not exceeding 95° C. prior to bonding said patterned first and second photopolymer layers together.

11. A method as claimed in claim 8, wherein after bonding said patterned first and second photopolymer layers are subjected to hardening treatment.

12. A method as claimed in claim 8, wherein said patterned first and second photopolymer layers are bonded together by applying heat and pressure to said carrier and device wafers.

13. A method as claimed in claim 8, wherein the silicon nitride layer has a thickness lying in the range of 0.05 μm to 1.0 μm.

14. A method as claimed in claim 8, wherein the patterned second photopolymer layer deposited on the device wafer is deposited in separate steps as two photopolymer sublayers.

15. A method as claimed in claim 8, wherein the exposure to anhydrous hydrofluoric acid is carried out in the presence of an organic volatile component.

16. A method as claimed in claim 8, wherein said carrier and device wafers are silicon wafers.

* * * * *